(12) United States Patent
Lu

(10) Patent No.: US 12,557,313 B2
(45) Date of Patent: Feb. 17, 2026

(54) SEMICONDUCTOR DEVICE

(71) Applicant: FUJI ELECTRIC CO., LTD., Kanagawa (JP)

(72) Inventor: Hong-fei Lu, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 392 days.

(21) Appl. No.: 18/357,158

(22) Filed: Jul. 24, 2023

(65) Prior Publication Data
US 2024/0079481 A1 Mar. 7, 2024

(30) Foreign Application Priority Data
Sep. 2, 2022 (JP) ................. 2022-140102

(51) Int. Cl.
*H10D 12/00* (2025.01)
*H10D 8/00* (2025.01)
*H10D 62/17* (2025.01)

(52) U.S. Cl.
CPC ............. *H10D 12/481* (2025.01); *H10D 8/00* (2025.01); *H10D 62/393* (2025.01)

(58) Field of Classification Search
CPC ...... H10D 12/481; H10D 8/00; H10D 62/393; H10D 8/80; H10D 62/129; H10D 8/422; H10D 12/00; H10D 62/127; H10D 62/142; H10D 64/117; H10D 64/519; H10D 62/126; H10D 62/10; H10D 62/107; H10D 12/038; H10D 64/111
USPC ....................................................... 257/140
See application file for complete search history.

(56) References Cited

U.S. PATENT DOCUMENTS

| | | | | |
|---|---|---|---|---|
| 2011/0193132 | A1* | 8/2011 | Kouno | H10D 12/481 257/E29.197 |
| 2014/0070270 | A1* | 3/2014 | Yoshida | H10D 8/411 257/140 |
| 2014/0374842 | A1* | 12/2014 | Weber | H10D 8/50 257/471 |
| 2015/0380536 | A1* | 12/2015 | Kimura | H10D 62/127 257/144 |
| 2018/0158815 | A1* | 6/2018 | Onozawa | H10D 84/0109 |
| 2018/0269315 | A1* | 9/2018 | Kato | H10D 62/105 |
| 2019/0123186 | A1* | 4/2019 | Philippou | H10D 12/461 |

(Continued)

FOREIGN PATENT DOCUMENTS

| | | |
|---|---|---|
| JP | 2011181886 A | 9/2011 |
| JP | 2014075582 A | 4/2014 |
| JP | 2019091892 A | 6/2019 |

*Primary Examiner* — Sheikh Maruf

(57) ABSTRACT

Provided is a semiconductor device including: a plurality of trench portions which are provided to positions below a base region from an upper surface of a semiconductor substrate and are arranged next to one another in a first direction on the upper surface of the semiconductor substrate; a first lower end region of a second conductivity type, which is arranged at a first depth position and is provided in contact with a lower end of two or more of the trench portions; and a second lower end region which is arranged at the first depth position and is arranged at a position not overlapping with the first lower end region, in which the second lower end region includes at least one of a region of a first conductivity type or a region of a second conductivity type which has a lower doping concentration than the first lower end region.

23 Claims, 18 Drawing Sheets

(56) References Cited

U.S. PATENT DOCUMENTS

| | | | |
|---|---|---|---|
| 2019/0157437 A1* | 5/2019 | Matsui | H10D 12/415 |
| 2019/0301946 A1* | 10/2019 | Sato | H01L 24/48 |
| 2021/0050436 A1* | 2/2021 | Vellei | H01L 21/26506 |
| 2021/0074836 A1* | 3/2021 | Naito | H10D 62/106 |
| 2021/0391452 A1* | 12/2021 | Kato | H10D 64/117 |
| 2022/0367443 A1* | 11/2022 | Laven | H03K 17/0828 |

\* cited by examiner

SEMICONDUCTOR DEVICE

BACKGROUND

1. Technical Field

The present invention relates to a semiconductor device.

2. Related Art

Conventionally, there is known a semiconductor device having a trench gate structure (see, for example, Patent Documents 1 to 3).

Patent Document 1: Japanese Patent Application Publication No. 2011-181886
Patent Document 2: Japanese Patent Application Publication No. 2014-75582
Patent Document 3: Japanese Patent Application Publication No. 2019-91892

DESCRIPTION OF EXEMPLARY EMBODIMENTS

Figure 1:
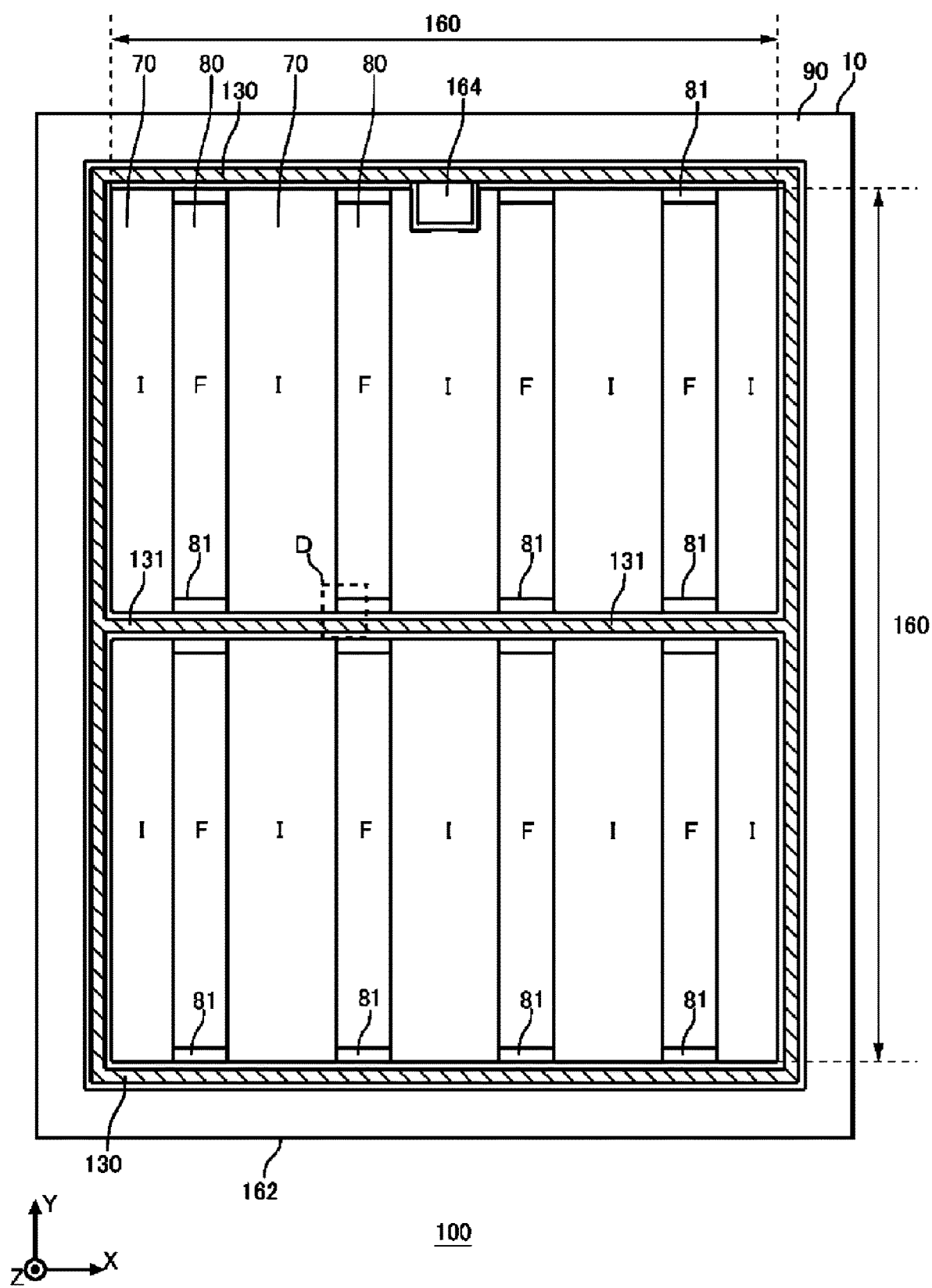
FIG. 1 illustrates a top view showing an example of a semiconductor device 100 according to one embodiment of the present invention.

Hereinafter, the invention will be described through embodiments of the invention, but the following embodiments do not limit the invention according to claims. In addition, not all of the combinations of features described in the embodiments are essential to the solution of the invention.

As used herein, one side in a direction parallel to a depth direction of a semiconductor substrate is referred to as "upper" and the other side is referred to as "lower". One surface of two principal surfaces of a substrate, a layer or other member is referred to as an upper surface, and the other surface is referred to as a lower surface. "Upper" and "lower" directions are not limited to a direction of gravity, or a direction in which a semiconductor device is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. Note that a +Z axis direction and a −Z axis direction are directions opposite to each other. When the Z axis direction is described without describing the signs, it means that the direction is parallel to the +Z axis and the −Z axis.

In the present specification, orthogonal axes parallel to the upper surface and the lower surface of the semiconductor substrate are defined as the X axis and the Y axis. Further, an axis perpendicular to the upper surface and the lower surface of the semiconductor substrate is referred to as the Z axis. In the present specification, the direction of the Z axis may be referred to as the depth direction. Further, in the present specification, a direction parallel to the upper surface and the lower surface of the semiconductor substrate may be referred to as a horizontal direction, including an X axis direction and a Y axis direction.

A region from the center of the semiconductor substrate in the depth direction to the upper surface of the semiconductor substrate may be referred to as an upper surface side. Similarly, a region from the center of the semiconductor substrate in the depth direction to the lower surface of the semiconductor substrate may be referred to as a lower surface side.

In the present specification, a case where a term such as "same" or "equal" is mentioned may include a case where an error due to a variation in manufacturing or the like is included. The error is, for example, within 10%.

In the present specification, a conductivity type of doping region where doping has been carried out with an impurity is described as a P type or an N type. In the present specification, the impurity may particularly mean either a donor of the N type or an acceptor of the P type, and may be described as a dopant. In the present specification, doping means introducing the donor or the acceptor into the semiconductor substrate and turning it into a semiconductor presenting a conductivity type of the N type, or a semiconductor presenting a conductivity type of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to the acceptor concentration set as a negative ion concentration, taking polarities of charges into account. As an example, when the donor concentration is $N_D$, the number of valence electrons per unit ion thereof is $n_D$, the acceptor concentration is $N_A$, and the number of valence electrons per unit ion thereof is $n_A$, the net doping concentration at any position is given as $n_D \times N_D - n_A \times N_A$. In the present specification, the net doping concentration may be simply referred to as the doping concentration.

The donor has a function of supplying electrons to a semiconductor. The acceptor has a function of receiving electrons from the semiconductor. The donor and acceptor are not limited to the impurities themselves. For example, a VOH defect which is a combination of a vacancy (V), oxygen (O), and hydrogen (H) existing in the semiconductor functions as the donor that supplies electrons. In the present specification, the VOH defect may be referred to as a hydrogen donor.

In the semiconductor substrate of the present specification, bulk donors of the N type are distributed throughout. The bulk donor is a dopant donor substantially uniformly contained in an ingot during the manufacture of the ingot from which the semiconductor substrate is made. The bulk donor of this example is an element other than hydrogen. The dopant of the bulk donor is, for example, phosphorus, antimony, arsenic, selenium, or sulfur, but the invention is not limited to these. The bulk donor of this example is phosphorus. The bulk donor is also contained in a P type region. The semiconductor substrate may be a wafer cut out from a semiconductor ingot, or may be a chip obtained by singulating the wafer. The semiconductor ingot may be manufactured by any one of a Czochralski method (CZ method), a magnetic field applied Czochralski method (MCZ method), and a float zone method (FZ method). The ingot in this example is manufactured by the MCZ method. An oxygen concentration contained in the substrate manufactured by the MCZ method is $1 \times 10^{17}$ to $7 \times 10^{17}/cm^3$. The oxygen concentration contained in the substrate manufactured by the FZ method is $1 \times 10^{15}$ to $5 \times 10^{16}/cm^3$. When the oxygen concentration is high, hydrogen donors tend to be easily generated. The bulk donor concentration may use a chemical concentration of bulk donors distributed throughout the semiconductor substrate, or may be a value between 90% and 100% of the chemical concentration. Each concentration in the present invention may be a value at room temperature. For the value at room temperature, a value at 300 K (Kelvin) (about 26.9° C.) may be used as an example.

In the present specification, a description of a P+ type or an N+ type means a higher doping concentration than that of the P type or the N type, and a description of a P− type or an N− type means a lower doping concentration than that of the P type or the N type. Further, in the present specification, a description of a P++ type or an N++ type means a higher doping concentration than that of the P+ type or the N+ type. In the present specification, a unit system is an SI base unit system unless otherwise particularly noted. Although a unit of length may be expressed in cm, calculations may be carried out after conversion to meters (m).

A chemical concentration in the present specification indicates an atomic density of an impurity measured regardless of an electrical activation state. The chemical concentration can be measured by, for example, secondary ion mass spectrometry (SIMS). The net doping concentration described above can be measured by capacitance-voltage profiling (CV profiling). Further, a carrier concentration measured by spreading resistance profiling (SRP method) may be set as the net doping concentration. The carrier concentration measured by the CV profiling or the SRP method may be a value in a thermal equilibrium state. Further, in a region of the N type, the donor concentration is sufficiently higher than the acceptor concentration, and thus the carrier concentration of the region may be set as the donor concentration. Similarly, in a region of the P type, the carrier concentration of the region may be set as the acceptor concentration. In the present specification, the doping concentration of the N type region may be referred to as the donor concentration, and the doping concentration of the P type region may be referred to as the acceptor concentration.

When a concentration distribution of the donor, acceptor, or net doping has a peak in a region, a value of the peak may be set as the concentration of the donor, acceptor, or net doping in the region. In a case where the concentration of the donor, acceptor, or net doping is substantially uniform in a region, or the like, an average value of the concentration of the donor, acceptor, or net doping in the region may be set as the concentration of the donor, acceptor, or net doping. In the present specification, atoms/cm$^3$ or/cm$^3$ is used to indicate a concentration per unit volume. This unit is used for the donor or acceptor concentration, or the chemical concentration in the semiconductor substrate. A notation of atoms may be omitted.

The carrier concentration measured by the SRP method may be lower than the concentration of the donor or the acceptor. In a range where a current flows when a spreading resistance is measured, carrier mobility of the semiconductor substrate may be lower than a value in a crystalline state. The reduction in carrier mobility occurs when carriers are scattered due to disorder (disorder) of a crystal structure due to a lattice defect or the like.

The concentration of the donor or the acceptor calculated from the carrier concentration measured by the CV profiling or the SRP method may be lower than a chemical concentration of an element indicating the donor or the acceptor. As an example, in a silicon semiconductor, a donor concentration of phosphorus or arsenic serving as a donor, or an acceptor concentration of boron (boron) serving as an acceptor is approximately 99% of chemical concentrations of these. On the other hand, in the silicon semiconductor, a donor concentration of hydrogen serving as a donor is approximately 0.1% to 10% of a chemical concentration of hydrogen.

FIG. 1 illustrates a top view showing an example of the semiconductor device 100 according to one embodiment of the present invention. FIG. 1 shows a position at which each member is projected on an upper surface of a semiconductor substrate 10. FIG. 1 shows merely some members of the semiconductor device 100, and omits illustrations of some members.

The semiconductor device 100 includes the semiconductor substrate 10. The semiconductor substrate 10 is a substrate that is formed of a semiconductor material. As an example, the semiconductor substrate 10 is a silicon substrate. The semiconductor substrate 10 has an end side 162 in the top view. When merely referred to as the top view in the present specification, it means that the semiconductor substrate 10 is viewed from an upper surface side. The semiconductor substrate 10 of this example has two sets of end sides 162 opposite to each other in the top view. In FIG. 1, the X axis and the Y axis are parallel to any of the end sides 162. In addition, the Z axis is perpendicular to the upper surface of the semiconductor substrate 10.

The semiconductor substrate 10 is provided with an active portion 160. The active portion 160 is a region where a main current flows in the depth direction between the upper surface and a lower surface of the semiconductor substrate 10 when the semiconductor device 100 operates. An emitter electrode is provided above the active portion 160, but is omitted in FIG. 1. The active portion 160 may refer to a region that overlaps with the emitter electrode in the top view. In addition, a region sandwiched by the active portion 160 in the top view may also be included in the active portion 160.

The active portion 160 is provided with a transistor portion 70 including a transistor element such as an insulated gate bipolar transistor (IGBT) and a diode portion 80 including a diode element such as a freewheeling diode (FWD). In the example of FIG. 1, the transistor portion 70 and the diode portion 80 are alternately arranged along a predetermined first direction (the X axis direction in this example) on the upper surface of the semiconductor substrate 10. The semiconductor device 100 of this example is a reverse-conducting IGBT (RC-IGBT).

In FIG. 1, a region where the transistor portion 70 is arranged is indicated by a symbol "I", and a region where the diode portion 80 is arranged is indicated by a symbol F. In the present specification, a direction different from the first direction in the top view is a second direction. The second direction may be a direction perpendicular to the first direction. As an example, the second direction is the Y axis direction. Each of the transistor portion 70 and the diode portion 80 may have a longitudinal length in the Y axis direction. In other words, the length of each of the transistor portions 70 in the Y axis direction is larger than the width in the X axis direction. Similarly, the length of each of the diode portions 80 in the Y axis direction is larger than the width in the X axis direction. The Y axis direction of the transistor portion 70 and the diode portion 80 may be the same as a longitudinal direction of each trench portion described below.

Each of the diode portions 80 includes a cathode region of the N+ type in a region in contact with the lower surface of the semiconductor substrate 10. In the present specification, a region where the cathode region is provided is referred to as the diode portion 80. In other words, the diode portion 80 is a region that overlaps with the cathode region in the top view. On the lower surface of the semiconductor substrate 10, a collector region of the P+ type may be provided in a region other than the cathode region. In the present specification, the diode portion 80 may also include an extension region 81 where the diode portion 80 extends to a gate runner described below in the Y axis direction. The collector region is provided on a lower surface of the extension region 81.

The transistor portion 70 has the collector region of the P+ type in a region in contact with the lower surface of the semiconductor substrate 10. Further, in the transistor portion 70, an emitter region of the N type, a base region of the P type, and a gate structure having a gate conductive portion and a gate dielectric film are periodically arranged on the upper surface side of the semiconductor substrate 10.

The semiconductor device 100 may have one or more pads above the semiconductor substrate 10. The semiconductor device 100 of this example has a gate pad 164. The semiconductor device 100 may have a pad such as an anode pad, a cathode pad, and a current detection pad. Each pad is arranged in a region close to the end side 162. The region close to the end side 162 indicates a region between the end side 162 and the emitter electrode in the top view. When the semiconductor device 100 is mounted, each pad may be connected to an external circuit via a wiring such as a wire.

A gate potential is applied to the gate pad 164. The gate pad 164 is electrically connected to a conductive portion of a gate trench portion of the active portion 160. The semiconductor device 100 includes a gate runner that connects the gate pad 164 and the gate trench portion. In FIG. 1, the gate runner is hatched with diagonal lines.

The gate runner of this example has an outer circumferential gate runner 130 and an active-side gate runner 131. The outer circumferential gate runner 130 is arranged between the active portion 160 and the end side 162 of the semiconductor substrate 10 in the top view. The outer circumferential gate runner 130 of this example encloses the active portion 160 in the top view. A region enclosed by the outer circumferential gate runner 130 in the top view may be the active portion 160. In addition, a well region is formed below the gate runner. The well region is a region of the P type having a higher concentration than the base region described below, and is formed to a position deeper than the base region from the upper surface of the semiconductor substrate 10. A region enclosed by the well region in the top view may be the active portion 160.

The outer circumferential gate runner 130 is connected to the gate pad 164. The outer circumferential gate runner 130 is arranged above the semiconductor substrate 10. The outer circumferential gate runner 130 may be a metal wiring containing aluminum or the like.

The active-side gate runner 131 is provided in the active portion 160. Providing the active-side gate runner 131 in the active portion 160 can reduce a variation in wiring length from the gate pad 164 for each region of the semiconductor substrate 10.

The outer circumferential gate runner 130 and the active-side gate runner 131 are connected to the gate trench portion of the active portion 160. The outer circumferential gate runner 130 and the active-side gate runner 131 are arranged above the semiconductor substrate 10. The outer circumferential gate runner 130 and the active-side gate runner 131 may be a wiring formed of a semiconductor such as polysilicon doped with an impurity.

The active-side gate runner 131 may be connected to the outer circumferential gate runner 130. The active-side gate runner 131 of this example is provided extending in the X axis direction so as to cross the active portion 160 from one outer circumferential gate runner 130 to the other outer circumferential gate runner 130 substantially at the center of the Y axis direction, the outer circumferential gate runner 130 enclosing the active portion 160. When the active portion 160 is divided by the active-side gate runner 131, the transistor portion 70 and the diode portion 80 may be alternately arranged in the X axis direction in each divided region.

The semiconductor device 100 may include a temperature sensing portion (not shown) that is a PN junction diode formed of polysilicon or the like, and a current detection portion (not shown) that simulates an operation of the transistor portion provided in the active portion 160.

The semiconductor device 100 of this example includes an edge termination structure portion 90 between the active portion 160 and the end side 162 in the top view. The edge termination structure portion 90 of this example is arranged between the outer circumferential gate runner 130 and the end side 162. The edge termination structure portion 90 relaxes an electric field strength on the upper surface side of the semiconductor substrate 10. The edge termination structure portion 90 may include at least one of a guard ring, a field plate, or a RESURF structure which is annularly provided to enclose the active portion 160.

Figure 2:
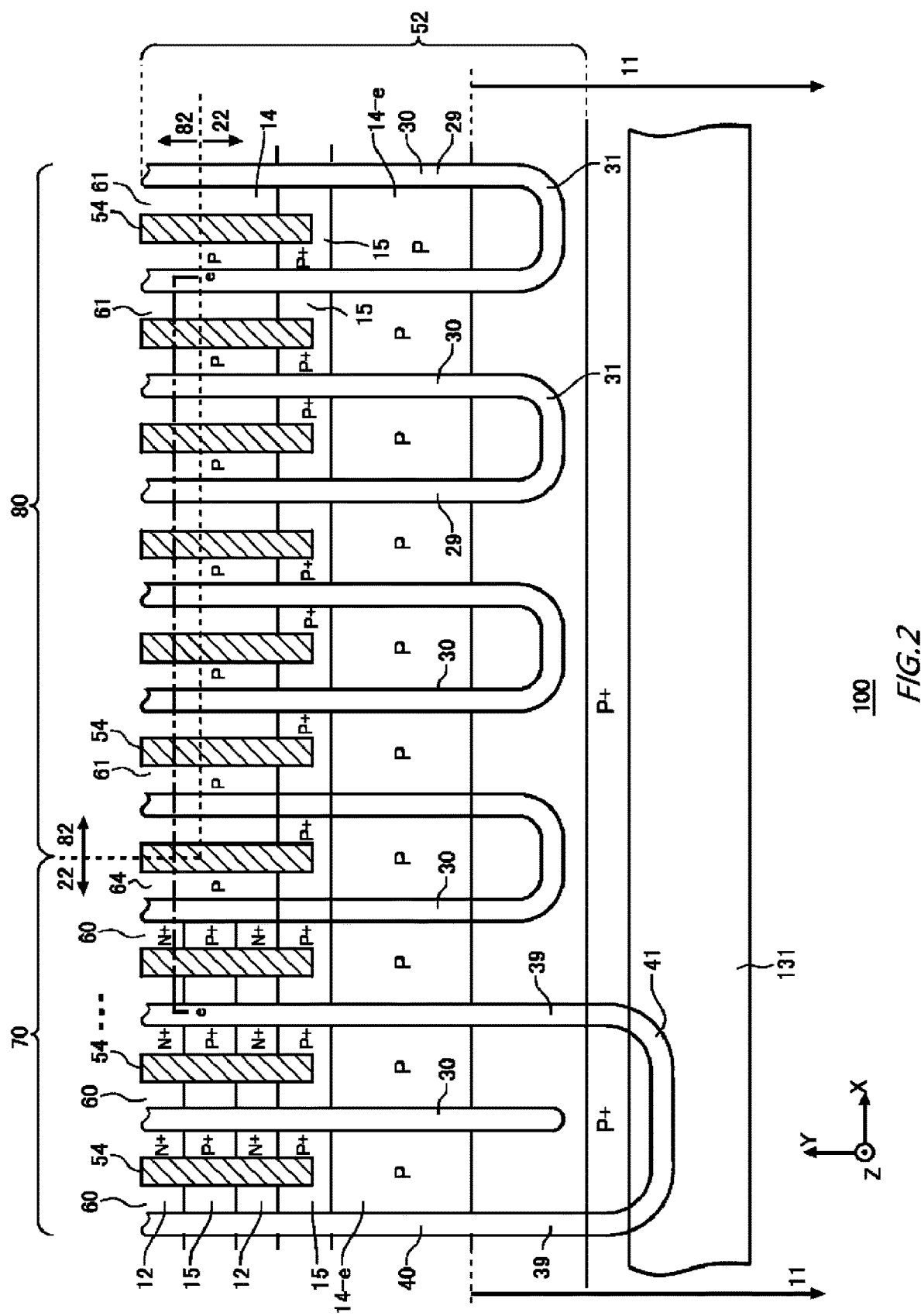
FIG. 2 illustrates an enlarged view of a region D in FIG. 1.

FIG. 2 illustrates an enlarged view of a region D in FIG. 1. The region D is a region including the transistor portion 70, the diode portion 80, and the active-side gate runner 131. The semiconductor device 100 of this example includes a gate trench portion 40, a dummy trench portion 30, a well region 11, an emitter region 12, a base region 14, and a contact region 15, which are provided inside the semiconductor substrate 10 on the upper surface side. The gate trench portion 40 and the dummy trench portion 30 each are an example of the trench portion. In addition, the semiconductor device 100 of this example includes an emitter electrode 52 and the active-side gate runner 131 which are provided above the upper surface of the semiconductor substrate 10. The emitter electrode 52 and the active-side gate runner 131 are provided separate from each other. The emitter electrode 52 is an example of an upper surface electrode.

Between the emitter electrode 52 and the active-side gate runner 131, and the upper surface of the semiconductor substrate 10, an interlayer dielectric film is provided, but an illustration thereof is omitted in FIG. 2. In the interlayer dielectric film of this example, a contact hole 54 is provided passing through the interlayer dielectric film. In FIG. 2, each contact hole 54 is hatched with the diagonal lines.

The emitter electrode 52 is provided above the gate trench portion 40, the dummy trench portion 30, the well region 11, the emitter region 12, the base region 14, and the contact region 15. The emitter electrode 52 is in contact with the emitter region 12, the contact region 15, and the base region 14 on the upper surface of the semiconductor substrate 10, through the contact hole 54. Further, the emitter electrode 52 is connected to a dummy conductive portion in the dummy trench portion 30 through a contact hole provided in the interlayer dielectric film. The emitter electrode 52 may be connected to the dummy conductive portion of the dummy trench portion 30 at an edge of the dummy trench portion 30 in the Y axis direction.

The active-side gate runner 131 is connected to the gate trench portion 40 through the contact hole provided in the interlayer dielectric film. The active-side gate runner 131 may be connected to a gate conductive portion of the gate trench portion 40 in an edge portion 41 of the gate trench portion 40 in the Y axis direction. The active-side gate runner 131 is not connected to the dummy conductive portion in the dummy trench portion 30.

The emitter electrode 52 is formed of a material including metal. FIG. 2 shows a range where the emitter electrode 52 is provided. For example, at least a part of a region of the emitter electrode 52 is formed of aluminum or an aluminum-silicon alloy, for example, a metal alloy such as AlSi and AlSiCu. The emitter electrode 52 may have a barrier metal formed of titanium, a titanium compound, or the like below a region formed of aluminum or the like. Further, a plug, which is formed by embedding tungsten or the like so as to be in contact with the barrier metal and aluminum or the like, may be included in the contact hole.

The well region 11 is provided so as to overlap with the active-side gate runner 131. The well region 11 is provided so as to extend with a predetermined width also in a range not overlapping with the active-side gate runner 131. The well region 11 of this example is provided away from an end of the contact hole 54 in the Y axis direction toward the active-side gate runner 131 side. The well region 11 is a region of a second conductivity type in which the doping concentration is higher than the base region 14. The base region 14 of this example is a P type, and the well region 11 is a P+ type.

Each of the transistor portion 70 and the diode portion 80 has a plurality of trench portions arrayed in the first direction (the X axis direction in FIG. 2). The transistor portion 70 of this example is alternately provided with one or more gate trench portions 40 and one or more dummy trench portions 30 along the X axis direction. The diode portion 80 of this example is provided with a plurality of dummy trench portions 30 along the X axis direction. In the diode portion 80 of this example, the gate trench portion 40 is not provided.

The gate trench portion 40 of this example may have two linear portions 39 extending along the Y axis direction perpendicular to the X axis direction (portions of a trench that are linear along the Y axis direction), and the edge portion 41 connecting the two linear portions 39. In the present specification, one linear portion 39 is assumed to be one gate trench portion 40.

At least a part of the edge portion 41 is preferably provided in a curved shape in a top view. By connecting end portions of the two linear portions 39 in the Y axis direction by the edge portion 41, it is possible to relax an electric field strength at the end portions of the linear portions 39.

In the transistor portion 70, the dummy trench portions 30 are provided between the respective linear portions 39 of the gate trench portions 40. Between the respective linear portions 39, one dummy trench portion 30 may be provided, or a plurality of dummy trench portions 30 may be provided. The dummy trench portion 30 may have a linear shape extending in the Y axis direction, or may have linear portions 29 and an edge portion 31 similar to the gate trench portion 40. In the present specification, one linear portion 29 is assumed to be one dummy trench portion 30. The semiconductor device 100 shown in FIG. 2 includes both of the linear dummy trench portion 30 having no edge portion 31, and the dummy trench portion 30 having the edge portion 31.

A diffusion depth of the well region 11 may be deeper than the depth of the gate trench portion 40 and the dummy trench portion 30. The end portions in the Y axis direction of the gate trench portion 40 and the dummy trench portion 30 are provided in the well region 11 in a top view. In other words, the bottom portion in the depth direction of each trench portion is covered with the well region 11 at the end portion in the Y axis direction of each trench portion. With this configuration, the electric field strength in the bottom portion of each trench portion can be relaxed.

A mesa portion is provided between the respective trench portions in the X axis direction. The mesa portion refers to a region sandwiched between the trench portions inside the semiconductor substrate 10. As an example, an upper end of the mesa portion is the upper surface of the semiconductor substrate 10. The depth position of the lower end of the mesa portion is the same as the depth position of the lower end of the trench portion. The mesa portion of this example is provided extending in the Y axis direction along the trench, on the upper surface of the semiconductor substrate 10. In this example, a mesa portion 60 is provided in the transistor portion 70, and a mesa portion 61 is provided in the diode portion 80. A boundary mesa portion 64 may be provided at a boundary between the transistor portion 70 and the diode portion 80 in the top view. A boundary between the cathode region 82 and the collector region 22 in the X axis direction may be assumed to be the boundary between the transistor portion 70 and the diode portion 80. As merely referred to as the mesa portion in the present specification, it indicates each of the mesa portion 60, the mesa portion 61, and the boundary mesa portion 64. Each mesa portion is provided with the base region 14. Of the base regions 14 exposed on the upper surface of the semiconductor substrate 10 in the mesa portion, a region arranged closest to the active-side gate runner 131 is assumed to be a base region 14-$e$. While FIG. 2 shows the base region 14-$e$ arranged at one end portion of each mesa portion in the Y axis direction, the base region 14-e is also arranged at the other end portion of each mesa portion. In each mesa portion, at least one of the emitter region 12 of the first conductivity type or the contact region 15 of the second conductivity type may be provided in a region sandwiched between the base regions 14-e in a top view. The emitter region 12 of this example is an N+ type, and the contact region 15 is a P+ type. The emitter region 12 and the contact region 15 may be provided between the base region 14 and the upper surface of the semiconductor substrate 10 in the depth direction.

The mesa portion 60 of the transistor portion 70 has the emitter region 12 exposed on the upper surface of the semiconductor substrate 10. The emitter region 12 is provided in contact with the gate trench portion 40. The mesa portion 60 in contact with the gate trench portion 40 may be provided with the contact region 15 exposed on the upper surface of the semiconductor substrate 10.

Each of the contact region 15 and the emitter region 12 in the mesa portion 60 is provided from one trench portion to the other trench portion in the X axis direction. As an example, the contact region 15 and the emitter region 12 in the mesa portion 60 are alternately arranged along the longitudinal direction of the trench portion (the Y axis direction).

In another example, the contact region 15 and the emitter region 12 in the mesa portion 60 may be provided in a stripe shape along the longitudinal direction of the trench portion (the Y axis direction). For example, the emitter region 12 is provided in a region in contact with the trench portion, and the contact region 15 is provided in a region sandwiched between the emitter regions 12.

The emitter region 12 is not provided in the mesa portion 61 of the diode portion 80.

The base region 14 and the contact region 15 may be provided on an upper surface of the mesa portion 61. The contact region 15 may be provided in contact with each of the base regions 14-e in a region sandwiched between the base regions 14-e on the upper surface of the mesa portion 61. The base region 14 may be provided in a region sandwiched between the contact regions 15 on the upper surface of the mesa portion 61. The base region 14 may be arranged in an entire region sandwiched between the contact regions 15.

The contact hole 54 is provided above each mesa portion. The contact hole 54 is arranged in the region sandwiched between the base regions 14-e. The contact hole 54 of this example is provided above each region of the contact region 15, the base region 14, and the emitter region 12. Further, the contact hole 54 is provided so as to pass through the contact region 15 and the emitter region 12 and come into contact with the base region 14. The contact hole 54 is not provided in regions corresponding to the base region 14-e and the well region 11. The contact hole 54 may be arranged at a center of the mesa portion in the X axis direction.

In the diode portion 80, an N+ type cathode region 82 is provided in a region in direct contact with the lower surface of the semiconductor substrate 10. On the lower surface of the semiconductor substrate 10, a P+ type collector region 22 may be provided in a region where the cathode region 82 is not provided. The cathode region 82 and the collector region 22 are provided between the lower surface 23 of the semiconductor substrate 10 and a buffer region 20. In FIG. 2, a boundary between the cathode region 82 and the collector region 22 is indicated by a dotted line.

The cathode region 82 is arranged apart from the well region 11 in the Y axis direction. With this configuration, the P type region which has a relatively high doping concentration and is formed to a deep position (the well region 11) does not have an FWD structure due to the collector region 22 existing immediately below the region. Accordingly, a distance between the well region 11 and the cathode region 82 is secured, and a carrier injection from the well region 11 during FWD conduction is reduced, with the result that a dynamic breakdown voltage when switching from ON to OFF can be improved. The end portion in the Y axis direction of the cathode region 82 of this example is arranged farther away from the well region 11 than the end portion in the Y axis direction of the contact hole 54. In another example, the end portion in the Y axis direction of the cathode region 82 may be arranged between the well region 11 and the contact hole 54.

Figure 3:
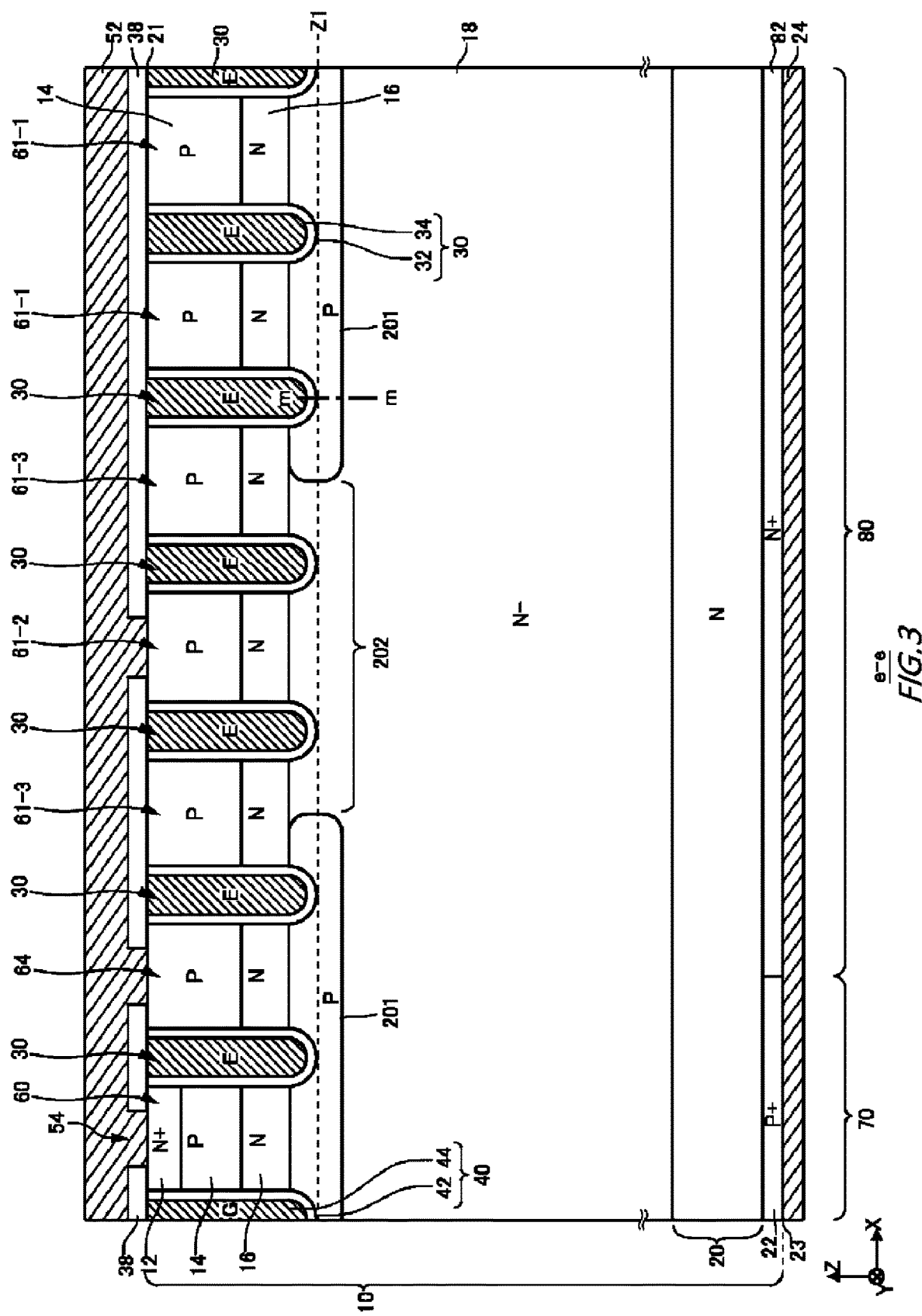
FIG. 3 illustrates a view showing an example of a cross section e-e in FIG. 2.

FIG. 3 illustrates a view showing an example of a cross section e-e in FIG. 2. The cross section e-e is an XZ plane passing through the emitter region 12 and the cathode region 82. The semiconductor device 100 of this example includes the semiconductor substrate 10, the interlayer dielectric film 38, the emitter electrode 52, and the collector electrode 24 in the cross section.

The interlayer dielectric film 38 is provided on the upper surface of the semiconductor substrate 10. The interlayer dielectric film 38 is a film including at least one layer of a dielectric film such as silicate glass to which an impurity such as boron or phosphorus is added, a thermal oxide film, or other dielectric films. The interlayer dielectric film 38 is provided with the contact hole 54 described in FIG. 2.

The emitter electrode 52 is provided above the interlayer dielectric film 38. The emitter electrode 52 is in contact with an upper surface 21 of the semiconductor substrate 10 through the contact hole 54 of the interlayer dielectric film 38. The collector electrode 24 is provided on a lower surface 23 of the semiconductor substrate 10. The emitter electrode 52 and the collector electrode 24 are formed of a metal material such as aluminum. In the present specification, the direction in which the emitter electrode 52 is connected to the collector electrode 24 (the Z axis direction) is referred to as a depth direction.

The semiconductor substrate 10 includes a drift region 18 of the N type or the N– type. The drift region 18 is provided in each of the transistor portion 70 and the diode portion 80. In the mesa portion 60 of the transistor portion 70, an N+ type of emitter region 12 and a P type of base region 14 are provided in order from an upper surface 21 side of the semiconductor substrate 10. The drift region 18 is provided below the base region 14. The mesa portion 60 may be provided with an N+ type of accumulation region 16. The accumulation region 16 is arranged between the base region 14 and the drift region 18.

The emitter region 12 is exposed on the upper surface 21 of the semiconductor substrate 10 and is provided in contact with gate trench portion 40. The emitter region 12 may be in contact with the trench portions on both sides of the mesa portion 60. The emitter region 12 has a higher doping concentration than the drift region 18.

The base region 14 is provided below the emitter region 12. The base region 14 of this example is provided in contact with the emitter region 12. The base region 14 may be in contact with the trench portions on both sides of the mesa portion 60.

The accumulation region 16 is provided below the base region 14. The accumulation region 16 is an N type region having a higher doping concentration than the drift region 18. That is, the accumulation region 16 has a higher donor concentration than the drift region 18. By providing the accumulation region 16 having the high concentration between the drift region 18 and the base region 14, it is possible to improve a carrier injection enhancement effect (IE effect) and reduce an on-voltage. The accumulation region 16 may be provided to entirely cover a lower surface of the base region 14 in each mesa portion 60.

The mesa portion 61 of the diode portion 80 is provided with the P type of base region 14 in contact with the upper surface 21 of the semiconductor substrate 10. The drift region 18 is provided below the base region 14. In the mesa portion 61, the accumulation region 16 may be provided between the base region 14 and the drift region 18.

In each of the transistor portion 70 and the diode portion 80, an N type buffer region 20 may be provided below the drift region 18. The doping concentration of the buffer region 20 is higher than the doping concentration of the drift region 18. The buffer region 20 may have a concentration peak having a higher doping concentration than the drift region 18. The doping concentration of the concentration peak refers to a doping concentration at a local maximum of the concentration peak. Further, as the doping concentration of the drift region 18, an average value of doping concentrations in a region where the doping concentration distribution is substantially flat may be used.

The buffer region 20 may have two or more concentration peaks in the depth direction (the Z axis direction) of the semiconductor substrate 10. The concentration peak of the buffer region 20 may be provided at the same depth position as, for example, a chemical concentration peak of hydrogen (a proton) or phosphorus. The buffer region 20 may function as a field stopper layer which prevents a depletion layer expanding from the lower end of the base region 14 from reaching the collector region 22 of the P+ type and the cathode region 82 of the N+ type.

In the transistor portion 70, the collector region 22 of the P+ type is provided below the buffer region 20. An acceptor concentration of the collector region 22 is higher than an acceptor concentration of the base region 14. The collector region 22 may include an acceptor which is the same as or different from an acceptor of the base region 14. The acceptor of the collector region 22 is, for example, boron.

Below the buffer region 20 in the diode portion 80, the cathode region 82 of the N+ type is provided. A donor concentration of the cathode region 82 is higher than a donor concentration of the drift region 18. A donor of the cathode region 82 is, for example, hydrogen or phosphorus. Note that an element serving as a donor and an acceptor in each region is not limited to the above-described example. The collector region 22 and the cathode region 82 are exposed on the lower surface 23 of the semiconductor substrate 10 and are connected to the collector electrode 24. The collector electrode 24 may be in contact with the entire lower surface 23 of the semiconductor substrate 10. The emitter electrode 52 and the collector electrode 24 are formed of a metal material such as aluminum.

One or more gate trench portions 40 and one or more dummy trench portions 30 are provided on the upper surface 21 side of the semiconductor substrate 10. In each view, the gate trench portion 40 may be indicated by a symbol G, and the dummy trench portion 30 may be indicated by a symbol E. Each trench portion passes through the base region 14 from the upper surface 21 of the semiconductor substrate 10, and is provided to below the base region 14. In a region where at least any one of the emitter region 12, the contact region 15, or the accumulation region 16 is provided, each trench portion also passes through the doping regions of these. The configuration of the trench portion penetrating the doping region is not limited to that manufactured in the order of forming the doping region and then forming the trench portion. The configuration of the trench portion penetrating the doping region also includes a configuration of the doping region being formed between the trench portions after forming the trench portion.

As described above, the transistor portion 70 is provided with the gate trench portion 40 and the dummy trench portion 30. The diode portion 80 of this example is provided with the dummy trench portion 30 and is not provided with the gate trench portion 40. In another example, the dummy trench portion 30 in a part of the diode portion 80 may be replaced by the gate trench portion 40. The boundary in the X axis direction between the diode portion 80 and the transistor portion 70 in this example is the boundary between the cathode region 82 and the collector region 22.

The gate trench portion 40 includes a gate trench provided in the upper surface 21 of the semiconductor substrate 10, a gate dielectric film 42, and a gate conductive portion 44. The gate dielectric film 42 is provided to cover the inner wall of the gate trench. The gate dielectric film 42 may be formed by oxidizing or nitriding a semiconductor on the inner wall of the gate trench. The gate conductive portion 44 is provided inside from the gate dielectric film 42 in the gate trench. That is, the gate dielectric film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered by the interlayer dielectric film 38 on the upper surface 21 of the semiconductor substrate 10. The gate conductive portion 44 is electrically connected to the gate runner. When a predetermined gate voltage is applied to the gate conductive portion 44, a channel is formed by an electron inversion layer in a surface layer of the base region 14 at a boundary in contact with the gate trench portion 40.

The dummy trench portions 30 may have the same structure as the gate trench portions 40 in the cross section. The dummy trench portion 30 includes a dummy trench provided in the upper surface 21 of the semiconductor substrate 10, a dummy dielectric film 32, and a dummy conductive portion 34. The dummy conductive portion 34 is electrically connected to the emitter electrode 52. The dummy dielectric film 32 is provided covering an inner wall of the dummy trench. The dummy conductive portion 34 is provided in the dummy trench, and is provided inside the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction.

The gate trench portion 40 and the dummy trench portion 30 of this example are covered by the interlayer dielectric film 38 on the upper surface 21 of the semiconductor substrate 10. Note that the bottom portions of the dummy trench portion 30 and the gate trench portion 40 may be formed in a curved-surface shape (a curved shape in the cross section) convexly downward.

The diode portion 80 includes one or more first lower end regions 201. The first lower end region 201 of this example is a P type region. Each of the first lower end regions 201 is in contact with lower ends of two or more trench portions (for example, two or more dummy trench portions 30)

arranged next to each another in the X axis direction. Each of the first lower end regions 201 is provided entirely across at least one of the mesa portions 61 in the X axis direction. At least one of the first lower end regions 201 may be in contact with lower ends of three or more trench portions. The first lower end region 201 in this case is provided entirely across at least two mesa portions 61 in the X axis direction.

Each of the first lower end regions 201 is arranged at a first depth position Z1. The first lower end region 201 being arranged at the first depth position Z1 means that the first lower end region 201 includes a portion arranged at the first depth position Z1. The first depth position Z1 may be a position in contact with the lower end of the trench portion. A position at which a doping concentration distribution of the first lower end region 201 in the depth direction shows a local maximum value may be set as the first depth position Z1. The first lower end region 201 may have a width in the depth direction (the Z axis direction). The width of the first lower end region 201 in the depth direction may be 0.5 μm or more, 1 μm or more, 1.5 μm or more, or 2 μm or more. The width of the first lower end region 201 in the depth direction may be measured at a position in contact with the lower end of the trench portion, or may be measured at a center position of the mesa portion 61 in the X axis direction. The width of the first lower end region 201 in the depth direction may be smaller than a width of the base region 14 in the depth direction. An N type intermediate region is provided between the first lower end region 201 and the base region 14. A doping concentration of the intermediate region may be higher than the doping concentration of the drift region 18. In the example of FIG. 3, the accumulation region 16 is the intermediate region. In another example, the drift region 18 may be provided as the intermediate region.

The doping concentration of the first lower end region 201 may be lower than or higher than the doping concentration of the base region 14. The doping concentration of the first lower end region 201 may be the same as the doping concentration of the base region 14. A potential of the first lower end region 201 may differ from a potential of the emitter electrode 52. In other words, the first lower end region 201 may be provided in a floating manner with respect to the emitter electrode 52. The first lower end region 201 does not need to be connected to neither the base region 14 nor the well region 11.

The diode portion 80 includes one or more second lower end regions 202. The second lower end region 202 is arranged at the first depth position Z1 and arranged at a position not overlapping with the first lower end region 201 in the top view. The second lower end region 202 may be arranged next to the first lower end region 201 in the X axis direction, may be arranged next to the first lower end region 201 in the Y axis direction, or may be arranged next to the first lower end region 201 in other directions. The second lower end region 202 may be arranged next to the first lower end region 201 in two directions within the XY plane. In the example of FIG. 3, the first lower end region 201 and the second lower end region 202 are arranged next to each other in the X axis direction.

The second lower end region 202 includes at least one of a region of the first conductivity type (the N type in this example) or a region of the second conductivity type (the P type in this example) which has a lower doping concentration than the first lower end region 201. In the example of FIG. 3, the second lower end region 202 is the drift region 18 of the N− type, that has remained without the first lower end region 201 being provided at the first depth position Z1 of the diode portion 80. The second lower end region 202 may be a region of the N type, which has a higher doping concentration than the drift region 18. The second lower end region 202 may be the accumulation region 16 provided at the first depth position Z1. A width of the second lower end region 202 in the depth direction may be the same as the width of the first lower end region 201 in the depth direction.

Each of the second lower end regions 202 may be in contact with the lower ends of two or more trench portions arranged next to one another in the X axis direction. The two or more trench portions may include the dummy trench portion 30, or may include the gate trench portion 40. The second lower end region 202 provided in the diode portion 80 may be in contact with the lower ends of two or more dummy trench portions 30. At least one of the second lower end regions 202 may be in contact with a lower end of a single trench portion. Each of the second lower end regions 202 may be provided entirely across at least one of the mesa portions 61 in the X axis direction, or may be provided in a part of one mesa portion 61. At least one of the second lower end regions 202 may be in contact with the lower ends of three or more trench portions. The second lower end region 202 in this case is provided entirely across at least two mesa portions 61 in the X axis direction.

By providing the first lower end region 201 in the diode portion 80, an electric field strength at the lower ends of the trench portions in contact with the first lower end region 201 can be relaxed. Note that when the first lower end region 201 is provided, a PN junction between the N type region such as the accumulation region 16 and the first lower end region 201 is inversely biased in a reverse-conducting mode in which the diode portion 80 performs an on-operation. In this case, a current does not flow through the PN junction until at least one of the accumulation region 16 or the first lower end region 201 is completely depleted. Therefore, regarding forward conduction characteristics (voltage-current characteristics in a forward direction) of the diode portion 80, it becomes easy to cause a snapback in which a low current flows before a predetermined trigger voltage is applied to the diode portion 80, and a high current flows after the trigger voltage is applied. In contrast, by providing the second lower end region 202 in the diode portion 80, it becomes easy for the current to flow via the second lower end region 202, so the snapback in the diode portion 80 can be suppressed.

In the top view of the diode portion 80, an area occupied by the first lower end region 201 may be larger than or smaller than an area occupied by the second lower end region 202. The area occupied by the first lower end region 201 may be the same as the area occupied by the second lower end region 202. The area of the diode portion 80 occupied by the second lower end region 202 may be 75% or less or 50% or less of an area of the diode portion 80. The area of the diode portion 80 occupied by the second lower end region 202 may be 10% or more or 20% or more of the area of the diode portion 80.

In the diode portion 80, the mesa portion 61 in which the first lower end region 201 is arranged in contact with the lower ends of two adjacent trench portions is assumed to be a first mesa portion 61-1. In other words, the first lower end region 201 is provided across the entire first mesa portion 61-1 in the X axis direction. The diode portion 80 may be provided with one or more first mesa portions 61-1.

In the diode portion 80, the mesa portion 61 in which the second lower end region 202 is arranged in contact with the lower ends of two adjacent trench portions is assumed to be a second mesa portion 61-2. In other words, the second lower end region 202 is provided across the entire second mesa portion 61-2 in the X axis direction. The diode portion 80 may be provided with one or more second mesa portions 61-2.

In this example, the first mesa portion 61-1 and the second mesa portion 61-2 are arranged next to each other in the X axis direction. The first mesa portion 61-1 and the second mesa portion 61-2 may be two mesa portions 61 arranged adjacent to each other, or may be two mesa portions 61 arranged apart from each other. By the diode portion 80 including the first mesa portion 61-1, an electric field strength in the vicinity of the lower ends of the two trench portions sandwiching the first mesa portion 61-1 can be relaxed. Moreover, by the diode portion 80 including the second mesa portion 61-2, a snapback in the reverse-conducting mode can be suppressed.

In the diode portion 80, the mesa portion 61 in which the first lower end region 201 is arranged in contact with the lower end of one of the two adjacent trench portions and the second lower end region 202 is arranged in contact with the lower end of the other one of the two adjacent trench portions is assumed to be a third mesa portion 61-3. On a lower surface of the third mesa portion 61-3, both the first lower end region 201 and the second lower end region 202 are provided.

In this example, the first mesa portion 61-1, the second mesa portion 61-2, and the third mesa portion 61-3 are arranged next to one another in the X axis direction. One third mesa portion 61-3 may be arranged between the first mesa portion 61-1 and the second mesa portion 61-2.

At least one of the second mesa portions 61-2 is connected to the emitter electrode 52. The emitter electrode 52 may be connected to the second mesa portion 61-2 via the contact hole 54 of the interlayer dielectric film 38. With this configuration, the second mesa portion 61-2 can operate as a diode. All of the second mesa portions 61-2 may be connected to the emitter electrode 52.

At least one of the first mesa portions 61-1 may be insulated from the emitter electrode 52. In other words, no contact hole 54 is provided in the interlayer dielectric film 38 covering the first mesa portion 61-1. A current does not flow in the first mesa portion 61-1 not connected to the emitter electrode 52. All of the first mesa portions 61-1 may be insulated from the emitter electrode 52. In this case, a snapback by the first mesa portion 61-1 does not occur. By adjusting a ratio at which the first mesa portion 61-1 and the second mesa portion 61-2 are provided, a current amount to flow in the diode portion 80 can be adjusted. At least one of the first mesa portions 61-1 may be connected to the emitter electrode 52. Also in this case, since the second mesa portion 61-2 is provided, an occurrence of a snapback can be suppressed. Further, the first mesa portion 61-1 may be connected in remote contact with the emitter electrode 52. The remote contact refers to, for example, a form in which the first mesa portion 61-1 is connected to the emitter electrode 52 through the contact hole 54 only at a portion of the base region 14-e at an end portion of the diode portion 80 in FIG. 2. Further, the first mesa portions 61-1 may be connected to the emitter electrode 52 through the contact holes 54 every fixed distance in the longitudinal direction of the trench (the Y axis direction). The fixed distance may be, for example, 10 times or more, 20 times or more, or 30 times or more of the mesa width in the X axis direction. The connection between the third mesa portion 61-3 and the emitter electrode 52 may be any form that has been described as the connection method of the first mesa portion 61-1 and the emitter electrode 52.

The boundary mesa portion 64 may be provided above the boundary between the cathode region 82 and the collector region 22 in the X axis direction. The boundary mesa portion 64 may have the same structure as the first mesa portion 61-1, may have the same structure as the second mesa portion 61-2, or may have the same structure as the third mesa portion 61-3. In the example of FIG. 3, the boundary mesa portion 64 has the same structure as the first mesa portion 61-1. In other words, the boundary mesa portion 64 is provided with the base region 14, the accumulation region 16, and the first lower end region 201.

By providing the first lower end region 201 in the boundary mesa portion 64, an implantation of a hole (holes) from the boundary mesa portion 64 to the drift region 18 is suppressed. Holes may also be implanted from the base region 14 of the transistor portion 70 to the drift region 18 of the diode portion 80. Therefore, an excessive amount of holes may be implanted to the diode portion 80. By suppressing the implantation of holes from the boundary mesa portion 64, the hole implantation amount to the diode portion 80 can be adjusted.

The boundary mesa portion 64 may be connected to the emitter electrode 52. With this configuration, a potential at the boundary between the transistor portion 70 and the diode portion 80 can be stabilized. In the diode portion 80, the third mesa portion 61-3 may be arranged between the boundary mesa portion 64 and the second mesa portion 61-2.

The transistor portion 70 may also be provided with the first lower end region 201. Of the plurality of mesa portions 60 in the transistor portion 70, the mesa portion 60 closest to the diode portion 80 may be provided with the first lower end region 201. In other words, a lower surface of the mesa portion 60 may be covered by the first lower end region 201 in contact with the lower ends of two adjacent trench portions. One first lower end region 201 may be provided in contact with lower ends of all the trench portions in the transistor portion 70. The first lower end region 201 may be provided across the entire transistor portion 70 in the X axis direction. The transistor portion 70 may also be provided with the second lower end region 202. By providing the first lower end region 201 in the transistor portion 70, an electric field strength in the vicinity of the lower ends of the trench portions of the transistor portion 70 can be relaxed.

The doping concentration of the first lower end region 201 in the transistor portion 70 may be the same as or different from the doping concentration of the first lower end region 201 in the diode portion 80. As an example, the doping concentration of the first lower end region 201 in the diode portion 80 may be higher than the doping concentration of the first lower end region 201 in the transistor portion 70. With this configuration, an electric field strength in the vicinity of the lower ends of the trench portions in the diode portion 80 can be relaxed. Although a snapback tends to occur easily with a high doping concentration of the first lower end region 201 in the diode portion 80, the diode portion 80 of this example is provided with the second lower end region 202. Therefore, even if the first lower end region 201 of the diode portion 80 has a high doping concentration, an occurrence of a snapback can sufficiently be suppressed. The doping concentration of the first lower end region 201 in the diode portion 80 may be 2 times or more or 5 times or more of the doping concentration of the first lower end region 201 in the transistor portion 70.

Figure 4:
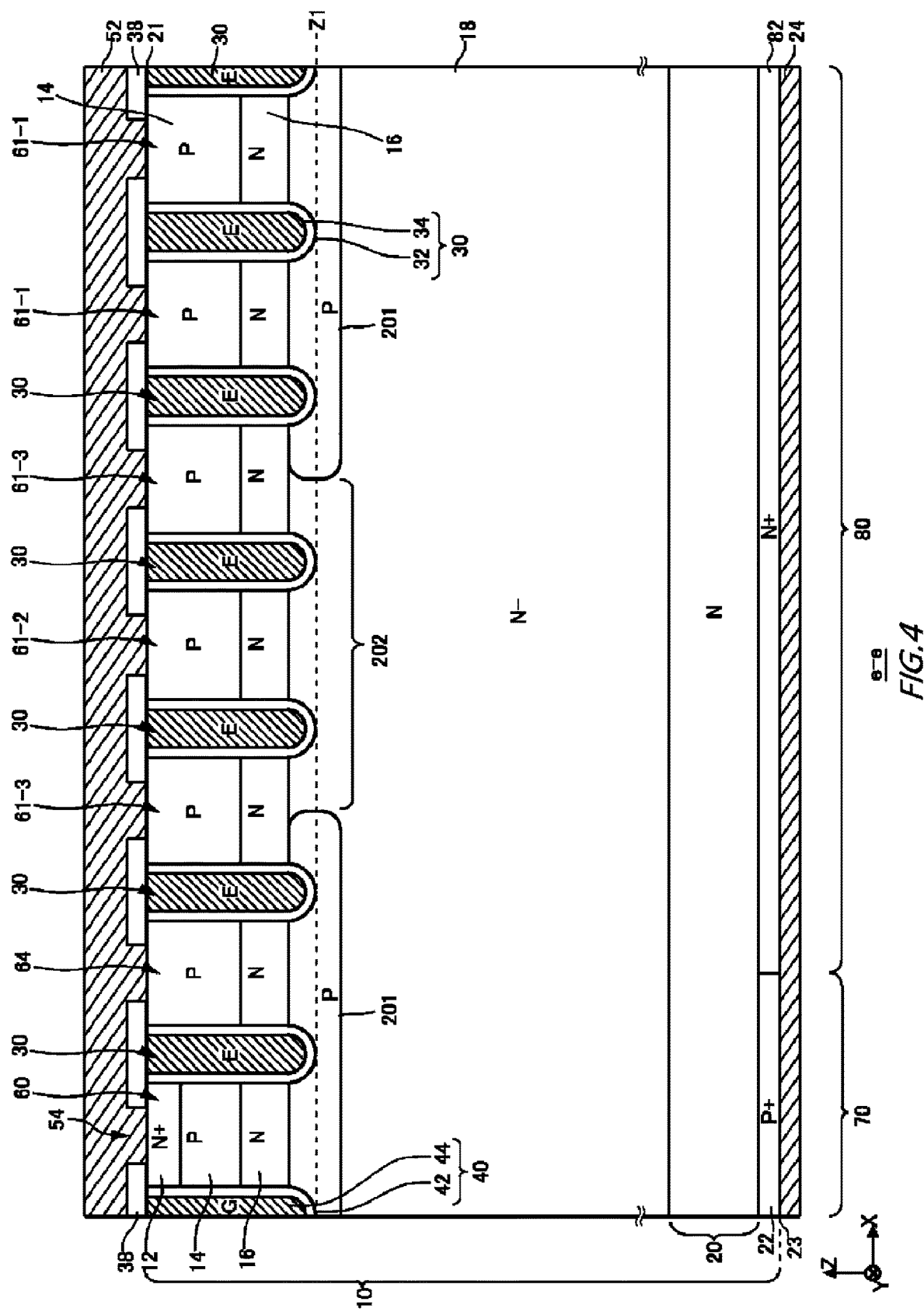
FIG. 4 illustrates a view showing another example of the cross section e-e.

FIG. 4 illustrates a view showing another example of the cross section e-e. In the semiconductor device 100 of this example, the arrangement of the contact holes 54 differs from that of the example of FIG. 3. Other structures are similar to those of any of the aspects described in FIG. 3.

In the example of FIG. 3, the contact hole 54 is not provided with respect to the first mesa portion 61-1. In this example, at least one of the first mesa portions 61-1 is connected to the emitter electrode 52 via the contact hole 54. All of the first mesa portions 61-1 may be connected to the emitter electrode 52. When the first mesa portion 61-1 is connected to the emitter electrode 52, the first mesa portion 61-1 and the base region 14, the accumulation region 16, the first lower end region 201, and the drift region 18 that are provided in regions below the first mesa portion 61-1 operate as thyristors.

When a forward current flows through the second mesa portion 61-2 in the reverse-conducting mode, a potential of the drift region 18 rises, or a base current flows through an NPN diode that uses the first lower end region 201 as a base, and thus the thyristors are set to an ON state. With this configuration, a current can also be caused to flow through the region where the first mesa portion 61-1 is provided, and a larger amount of current can be caused to flow through the diode portion 80.

In the example of FIG. 3, the contact hole 54 is not provided with respect to the third mesa portion 61-3. In this example, at least one of the third mesa portions 61-3 may be connected to the emitter electrode 52 via the contact hole 54. All of the third mesa portions 61-3 may be connected to the emitter electrode 52. With this configuration, a larger amount of current can be caused to flow through the diode portion 80.

Figure 5:
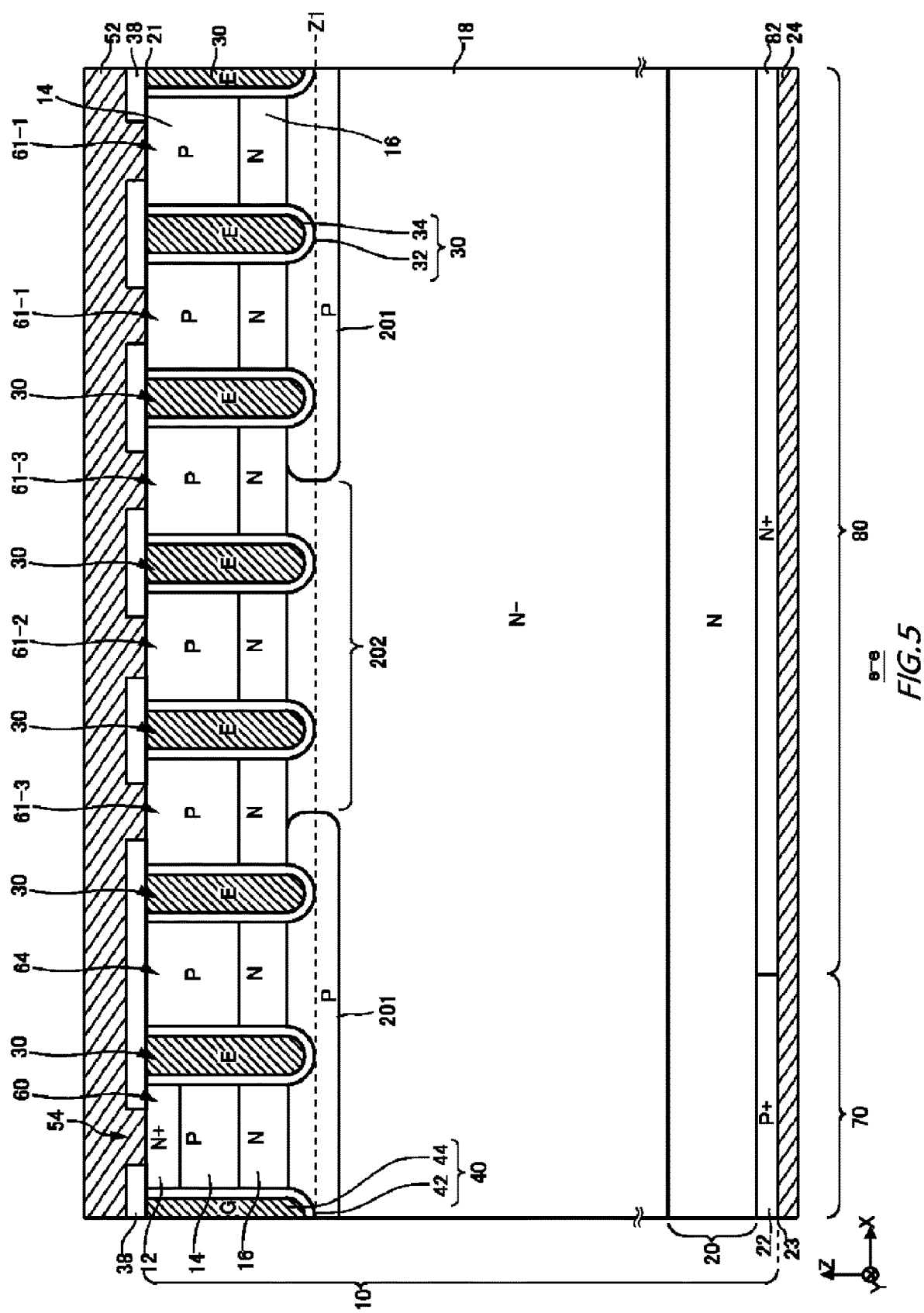
FIG. 5 illustrates a view showing another example of the cross section e-e.

FIG. 5 illustrates a view showing another example of the cross section e-e. In the semiconductor device 100 of this example, the arrangement of the contact hole 54 with respect to the boundary mesa portion 64 differs from that of the example of FIG. 3 or 4. Other structures are similar to those of any of the aspects described in FIG. 3 or 4.

The boundary mesa portion 64 of this example is insulated from the emitter electrode 52. Other structures of the boundary mesa portion 64 are similar to those of the first mesa portion 61-1. With such a configuration, the implantation of holes from the boundary mesa portion 64 can be suppressed, and the hole implantation amount to the diode portion 80 can be adjusted. Further, the boundary mesa portion 64 may be in the electrical remote contact described above with the emitter electrode 52.

Figure 6:
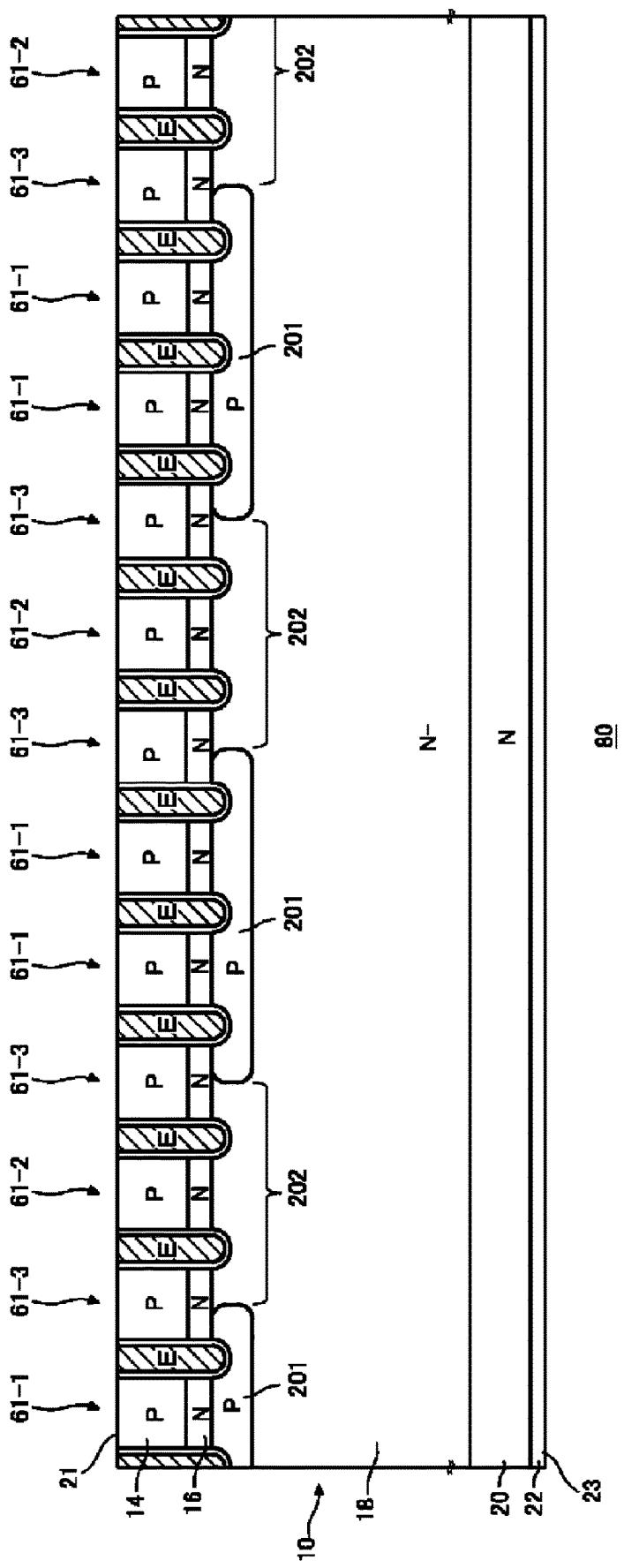
FIG. 6 illustrates a view showing an exemplary arrangement of a first lower end region 201 and a second lower end region 202 in an X axis direction in a diode portion 80.

FIG. 6 illustrates a view showing an exemplary arrangement of the first lower end region 201 and the second lower end region 202 in the X axis direction in the diode portion 80. FIG. 6 shows an XZ cross section of the semiconductor substrate 10. In FIG. 6, illustrations of the interlayer dielectric film 38, the emitter electrode 52, and the collector electrode 24 are omitted. Configurations other than the arrangement of the first lower end region 201 and the second lower end region 202 are similar to those of any of the aspects described in FIGS. 3 to 5.

In this example, at least one of the second lower end regions 202 is arranged while being sandwiched between two first lower end regions 201 in the X axis direction. In addition, at least one of the first lower end regions 201 is arranged while being sandwiched between two second lower end regions 202 in the X axis direction. In other words, the first lower end region 201 and the second lower end region 202 are alternately arranged while being repeated two or more times in the X axis direction. By alternately and repetitively arranging the first lower end region 201 and the second lower end region 202, it becomes easy to suppress an occurrence of a snapback due to the provision of the first lower end region 201.

At least one of the second mesa portions 61-2 is arranged while being sandwiched between two first mesa portions 61-1 in the X axis direction. In addition, at least one of the first mesa portions 61-1 is arranged while being sandwiched between two second mesa portions 61-2 in the X axis direction. The third mesa portion 61-3 may be arranged between the first mesa portion 61-1 and the second mesa portion 61-2. By alternately and repetitively arranging the first mesa portion 61-1 and the second mesa portion 61-2, it becomes easy to suppress an occurrence of a snapback in the first mesa portion 61-1.

Figure 7:
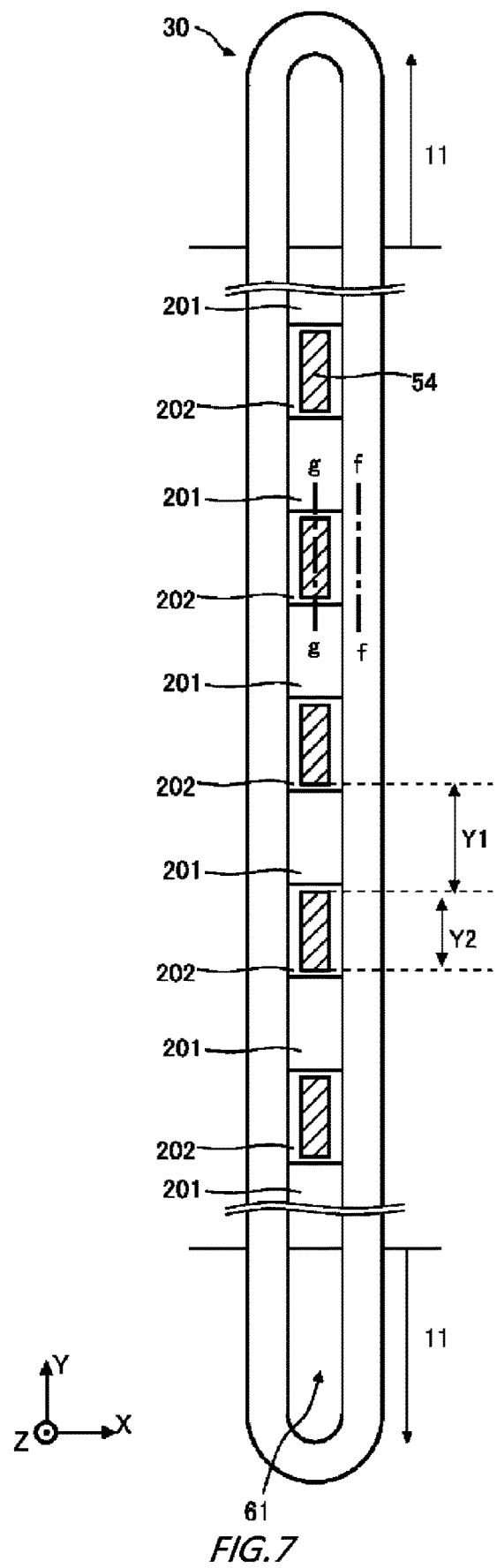
FIG. 7 illustrates a view showing an exemplary arrangement of the first lower end region 201 and the second lower end region 202 in a mesa portion 61.

FIG. 7 illustrates a view showing an exemplary arrangement of the first lower end region 201 and the second lower end region 202 in the mesa portion 61. In FIGS. 3 to 6, the first lower end region 201 and the second lower end region 202 are arranged next to each other in the X axis direction. In this example, the first lower end region 201 and the second lower end region 202 are arranged next to each other in the Y axis direction. With this configuration, it is possible to suppress an occurrence of a snapback while relaxing the electric field strength in the vicinity of the lower ends of the trench portions. Structures other than the arrangement of the first lower end region 201 and the second lower end region 202 in the Y axis direction are similar to those of any of the aspects described in FIGS. 1 to 6.

In all of the mesa portions 61 of the diode portion 80, the first lower end region 201 and the second lower end region 202 may be arranged next to each other in the Y axis direction. In another example, in some of the mesa portions 61 of the diode portion 80, the first lower end region 201 and the second lower end region 202 may be arranged next to each other in the Y axis direction. For example, in the first mesa portion 61-1 and the third mesa portion 61-3 described in FIGS. 3 to 6, the first lower end region 201 and the second lower end region 202 may be arranged next to each other in the Y axis direction. In other words, the first lower end region 201 described in FIGS. 3 to 6 may be arranged discretely in the Y axis direction. A region not provided with the first lower end region 201 is provided with the second lower end region 202. The second mesa portion 61-2 may be provided with the second lower end region 202 without being provided with the first lower end region 201. In this case, the first lower end region 201 and the second lower end region 202 are arranged next to each other in both the X axis direction and the Y axis direction. With this configuration, it becomes easier to suppress the occurrence of a snapback. Moreover, also in the boundary mesa portion 64 and the mesa portion 60 of the transistor portion 70, the first lower end region 201 and the second lower end region 202 may be arranged next to each other in the Y axis direction.

At least one of the second lower end regions 202 may be arranged while being sandwiched between two first lower end regions 201 in the Y axis direction. In addition, at least one of the first lower end regions 201 may be arranged while being sandwiched between two second lower end regions 202 in the Y axis direction. In other words, the first lower end region 201 and the second lower end region 202 may be alternately arranged while being repeated two or more times in the Y axis direction. By alternately and repetitively arranging the first lower end region 201 and the second lower end region 202, it becomes easy to suppress an occurrence of a snapback due to the provision of the first lower end region 201. As shown in FIG. 7, the mesa portion 61 may be sandwiched between two well regions 11 in the Y axis direction. The first lower end region 201 and the second lower end region 202 may be alternately arranged between the two well regions 11 in the Y axis direction.

A plurality of contact holes 54 may be arranged discretely in the Y axis direction above the mesa portion 61 of this example. A distance Y1 between the contact holes 54 adjacent to each other in the Y axis direction may be 10 μm or more, 100 μm or more, or 1,000 μm or more. The distance Y1 may be half or less, ¼ or less, or 1/10 or less of the length of the mesa portion 61 in the Y axis direction. The distance Y1 may be larger than, smaller than, or the same as a length Y2 of one contact hole 54 in the Y axis direction.

At least one of the second lower end regions 202 may have a portion overlapping with the contact hole 54 in a top view. The second lower end region 202 may be provided to cover the entire contact hole 54 in the top view. The first lower end region 201 may have a portion not overlapping with the contact hole 54 in the top view. The first lower end region 201 may be provided so as not to overlap even partially with the contact hole 54 in the top view.

Figure 8:
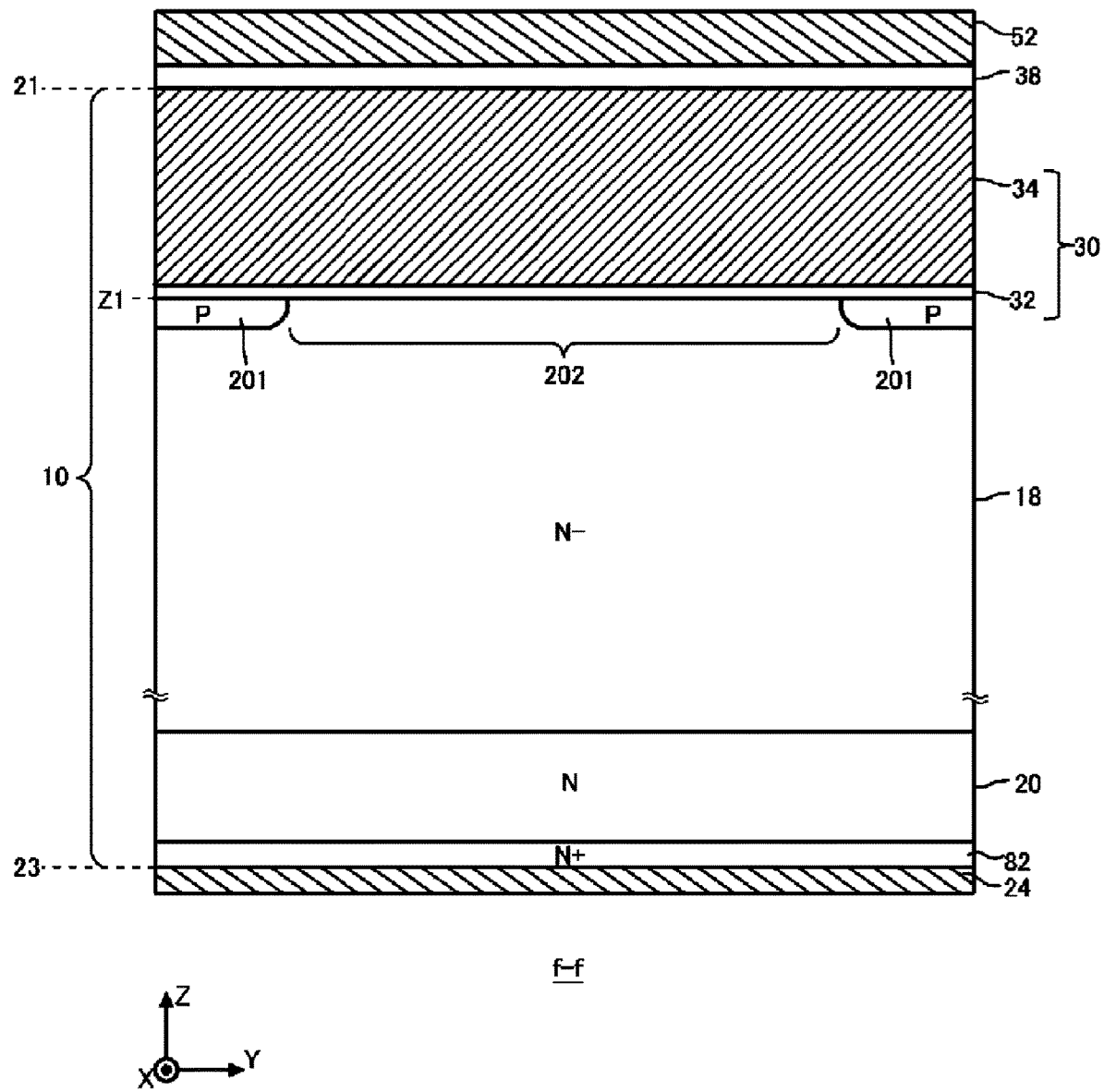
FIG. 8 illustrates a view showing an example of a cross section f-f in FIG. 7.

FIG. 8 illustrates a view showing an example of a cross section f-f in FIG. 7. The cross section f-f is a YZ plane that passes through the dummy trench portion 30 opposing the contact hole 54 in the X axis direction. As shown in FIG. 8, the first lower end region 201 and the second lower end region 202 are alternately arranged in the Y axis direction while being in contact with the lower end of the dummy trench portion 30.

Figure 9:
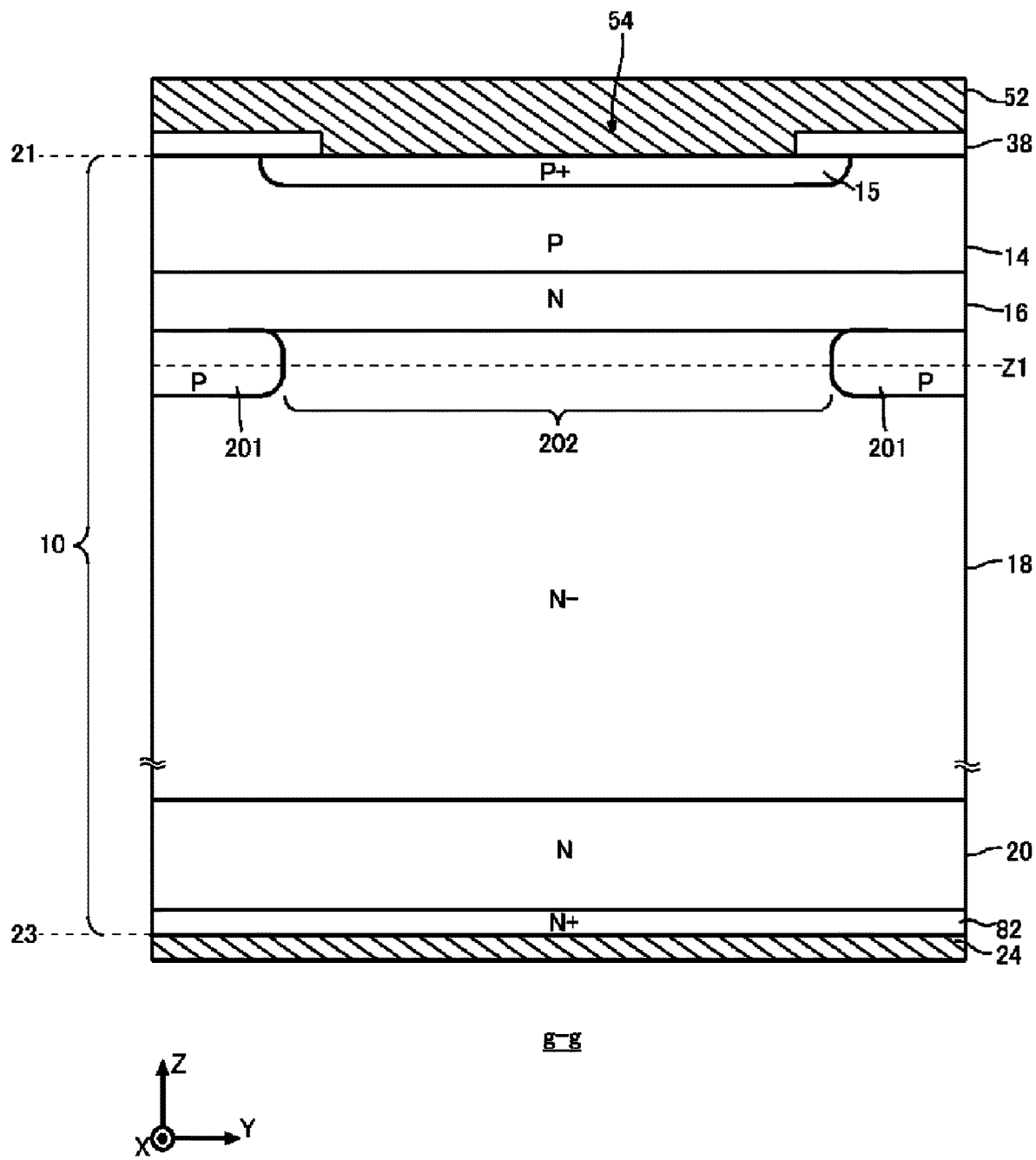
FIG. 9 illustrates a view showing an example of a cross section g-g in FIG. 7.

FIG. 9 illustrates a view showing an example of a cross section g-g in FIG. 7. The cross section g-g is a YZ plane that passes through the contact hole 54. As described above, at least one of the second lower end regions 202 is arranged so as to overlap with the contact hole 54. With this configuration, it becomes easy to extract holes that have passed through the second lower end region 202 to the emitter electrode 52, and to cause a current to flow through the second lower end region 202. Therefore, the snapback can be further suppressed.

The mesa portion 61 may be provided with the contact region 15 of the P+ type, which has a higher doping concentration than the base region 14. The contact region 15 and the base region 14 may be alternately arranged in the Y axis direction. The contact region 15 is provided between the base region 14 and the upper surface 21 of the semiconductor substrate 10. The contact region 15 is connected to the emitter electrode 52 by the contact hole 54.

At least one of the second lower end regions 202 may have a portion overlapping with the contact region 15 in the top view. All of the second lower end regions 202 may have a portion overlapping with the contact region 15. By providing the second lower end region 202 below the contact region 15, it becomes easy to extract holes that have passed through the second lower end region 202 to the collector electrode 24, and to cause a current to flow through the second lower end region 202. Therefore, the snapback can be further suppressed.

Figure 10:
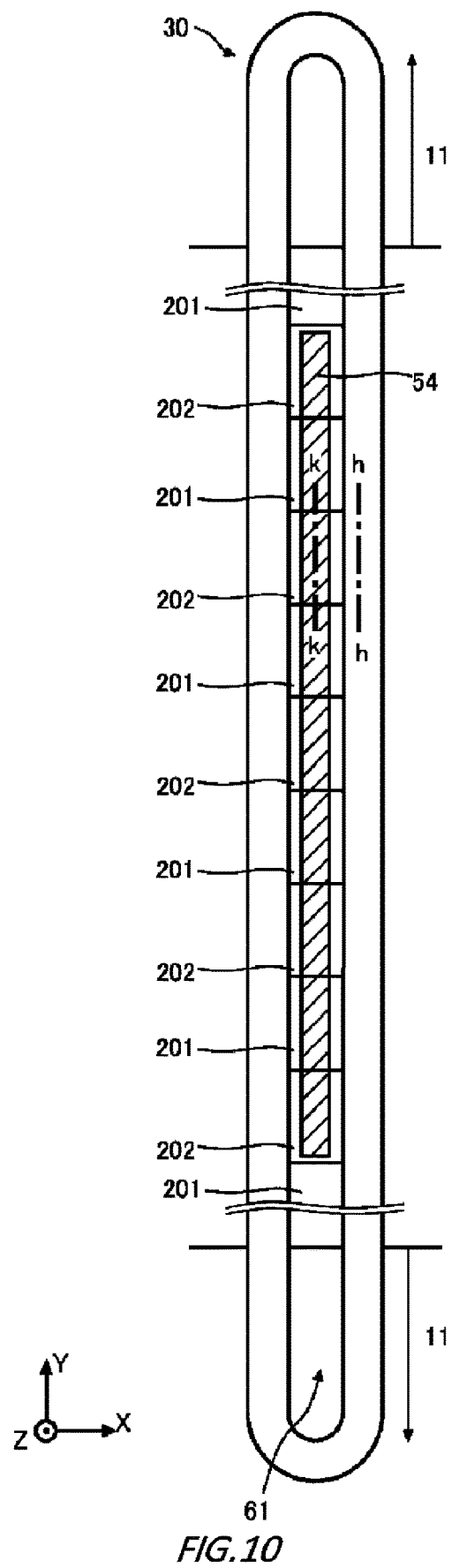
FIG. 10 illustrates a view showing another exemplary arrangement of a contact hole 54 in the mesa portion 61.

FIG. 10 illustrates a view showing another exemplary arrangement of the contact hole 54 in the mesa portion 61. Structures other than the contact hole 54 are similar to those of any of the aspects described in FIGS. 1 to 9. The contact hole 54 of this example is provided so as to overlap with two or more second lower end regions 202 arranged next to each other in the Y axis direction. As shown in FIG. 10, the mesa portion 61 may be provided with a single contact hole 54 overlapping with all of the second lower end regions 202 provided in the mesa portion 61. In the mesa portion 61, the first lower end regions 201 arranged at both ends in the Y axis direction may or may not overlap with the contact hole 54. The contact hole 54 does not overlap with the well regions 11.

Figure 11:
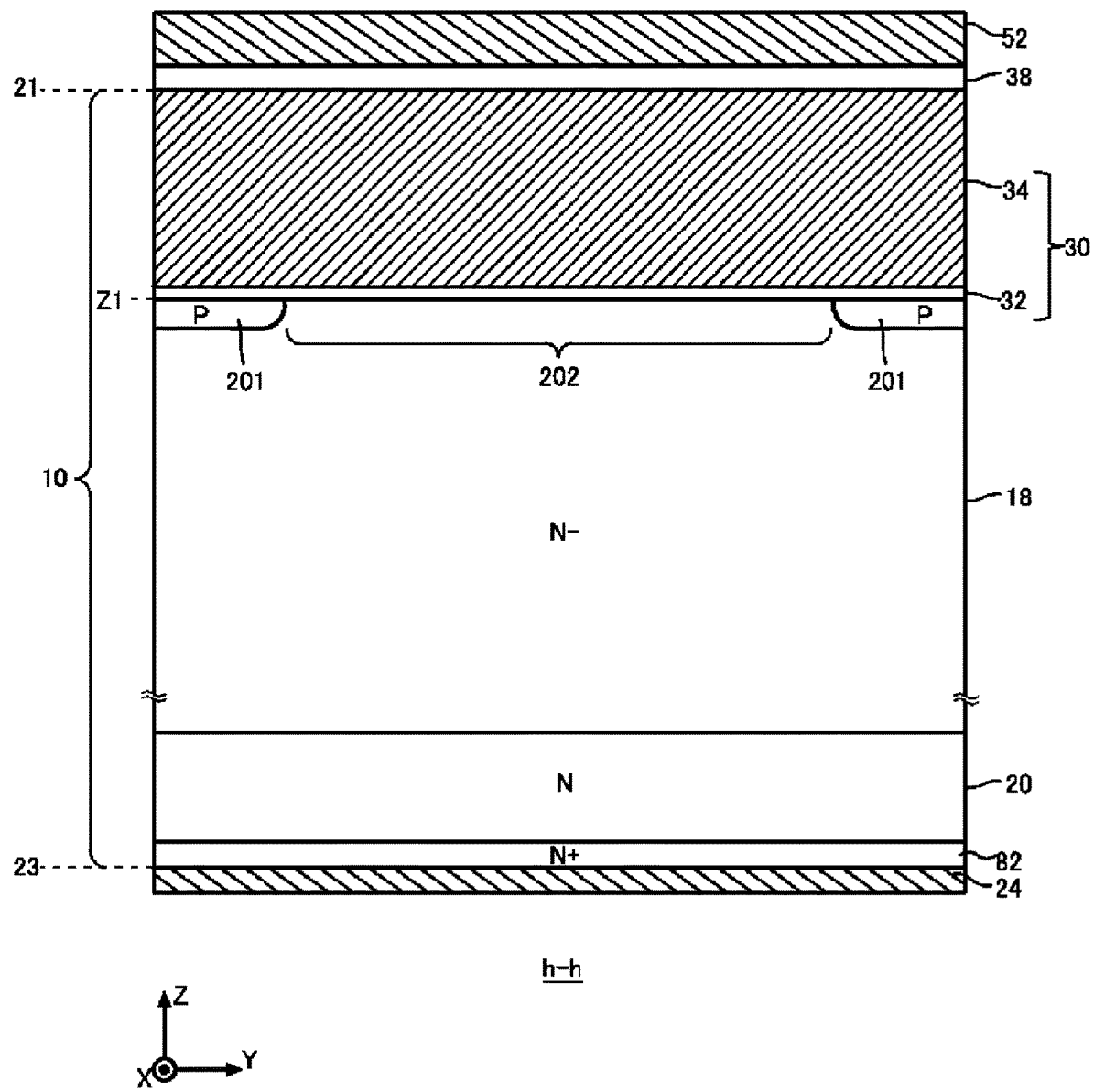
FIG. 11 illustrates a view showing an example of a cross section h-h in FIG. 10.

FIG. 11 illustrates a view showing an example of a cross section h-h in FIG. 10. The cross section h-h is a YZ plane that passes through the dummy trench portion 30 opposing one second lower end region 202 in the X axis direction. As shown in FIG. 11, the first lower end region 201 and the second lower end region 202 are alternately arranged in the Y axis direction while being in contact with the lower end of the dummy trench portion 30.

Figure 12:
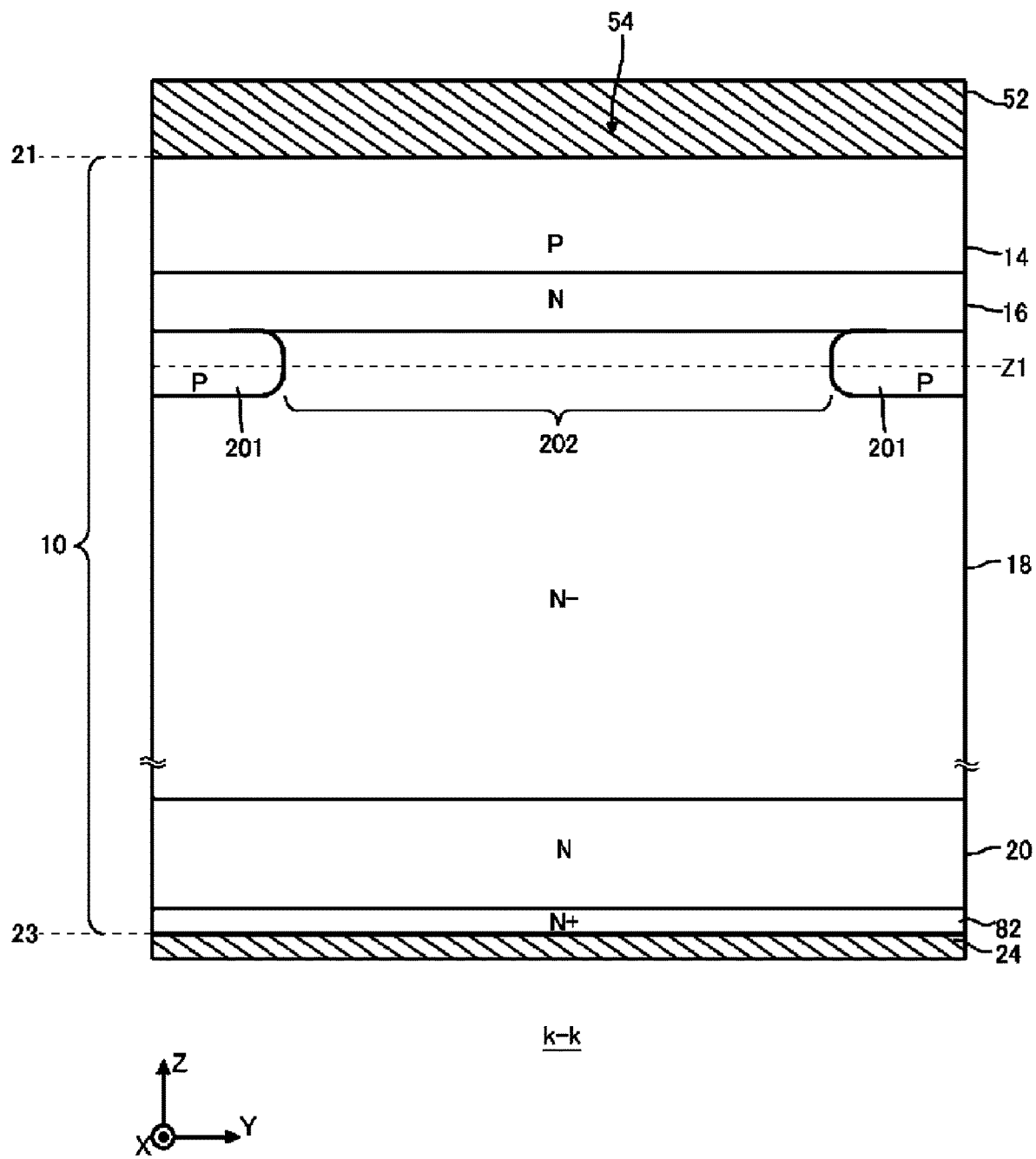
FIG. 12 illustrates a view showing an example of a cross section k-k in FIG. 10.

FIG. 12 illustrates a view showing an example of a cross section k-k in FIG. 10. The cross section k-k is a YZ plane that passes through the first lower end region 201 and the second lower end region 202. The second lower end region 202 of this example is arranged so as to overlap with the contact hole 54. With this configuration, it becomes easy to extract holes that have passed through the second lower end region 202 to the collector electrode 24, and to cause a current to flow through the second lower end region 202. Therefore, the snapback can be further suppressed. Also in this example, similar to the example of FIG. 9, the mesa portion 61 may or may not be provided with the contact region 15 overlapping with the second lower end region 202.

Figure 13:
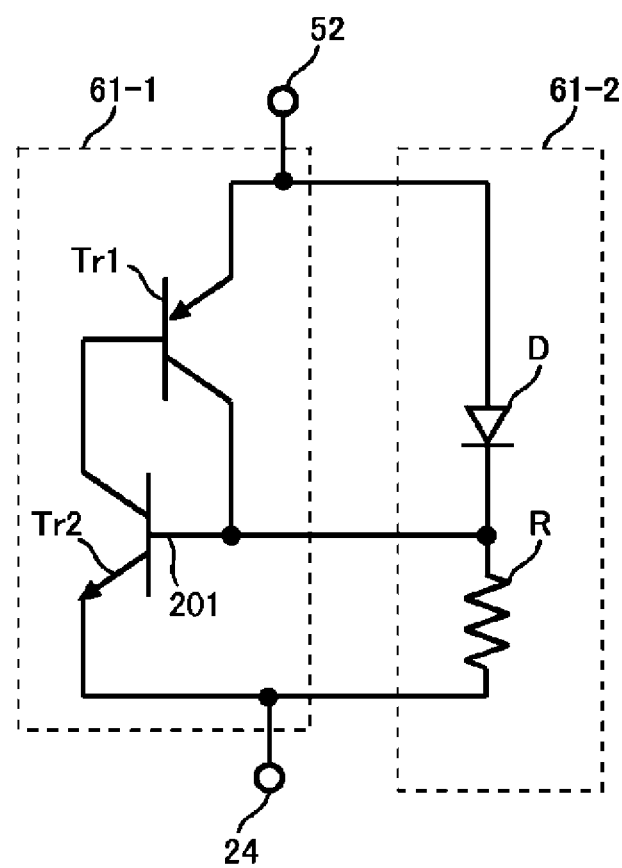
FIG. 13 illustrates a view showing an example of an equivalent circuit of the diode portion 80.

FIG. 13 illustrates a view showing an example of an equivalent circuit of the diode portion 80. FIG. 13 shows the first mesa portion 61-1, the second mesa portion 61-2, and a circuit in a region below these mesa portions. The second mesa portion 61-2 is indicated by a diode D and a resistor R. The diode D is a diode of a PN junction including the base region 14 and the accumulation region 16. The resistor R is an on-resistance component in the second lower end region 202 and the drift region 18. The first mesa portion 61-1 of this example is connected to the emitter electrode 52 as shown in FIG. 4. In this case, the first mesa portion 61-1 and a region below it operate as thyristors. In FIG. 13, the thyristors are indicated by a transistor Tr1 and a transistor Tr2. The transistor Tr1 is a PNP transistor including the base region 14, the accumulation region 16, and the first lower end region 201. The transistor Tr2 is an NPN transistor including the accumulation region 16, the first lower end region 201, and the drift region 18. A base of the transistor Tr2 corresponds to the first lower end region 201.

In this example, when a forward current flows through the second mesa portion 61-2, a potential of the base of the transistor Tr2 rises by the resistor R, and a base current is supplied to the transistor Tr2. With this configuration, the thyristor of the first mesa portion 61-1 is set to an ON state, and a current also flows through the first mesa portion 61-1. Therefore, a current that flows through the diode portion 80 can be increased.

Figure 14:
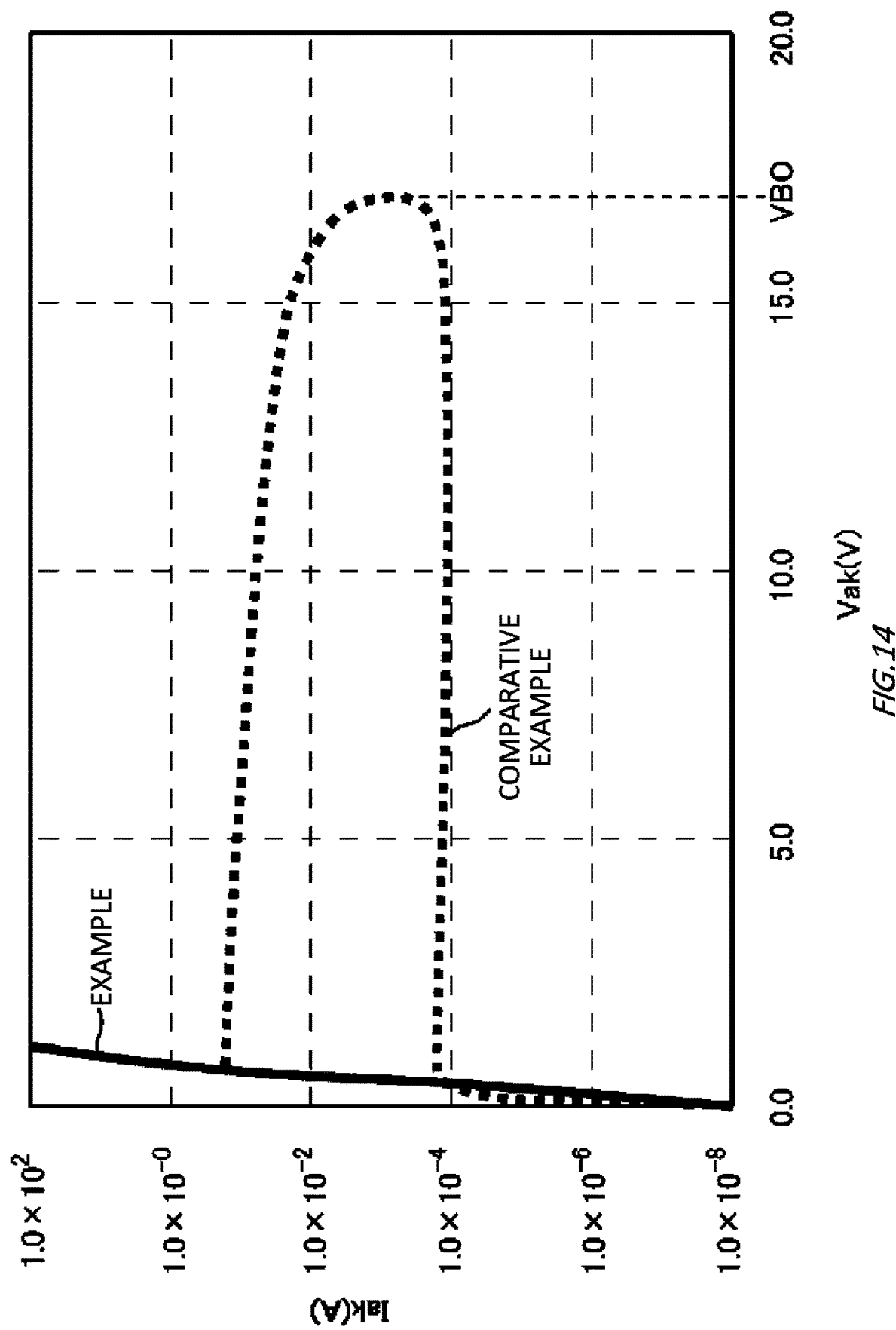
FIG. 14 illustrates a view showing an example of forward conduction characteristics of the diode portion 80.

FIG. 14 illustrates a view showing an example of the forward conduction characteristics of the diode portion 80. The horizontal axis of FIG. 14 represents an inter-anode-cathode voltage Vak (V) of the diode portion 80, and the vertical axis represents an inter-anode-cathode current Iak (A) of the diode portion 80. In FIG. 14, characteristics of a comparative example are indicated by a broken line, and characteristics of an example are indicated by a solid line. In the diode portion 80 of the comparative example, all of the mesa portions 61 are the first mesa portion 61-1 covered by the first lower end region 201. The example is the diode portion 80 having the structure shown in FIG. 3.

As indicated by the characteristics of the comparative example shown in FIG. 14, when all of the mesa portions 61 of the diode portion 80 are the first mesa portions 61-1, the inter-anode-cathode current Iak (A) is suppressed until the inter-anode-cathode voltage Vak reaches a trigger voltage VBO by a snapback phenomenon. The comparative example shows snapback characteristics in which a large inter-anode-cathode current Iak (A) flows after the inter-anode-cathode voltage Vak reaches the trigger voltage VBO. In contrast, in the example, by setting some of the mesa portions 61 of the diode portion 80 to be the second mesa portions 61-2, normal diode characteristics are shown without showing the snapback characteristics as in the comparative example.

Figure 15:
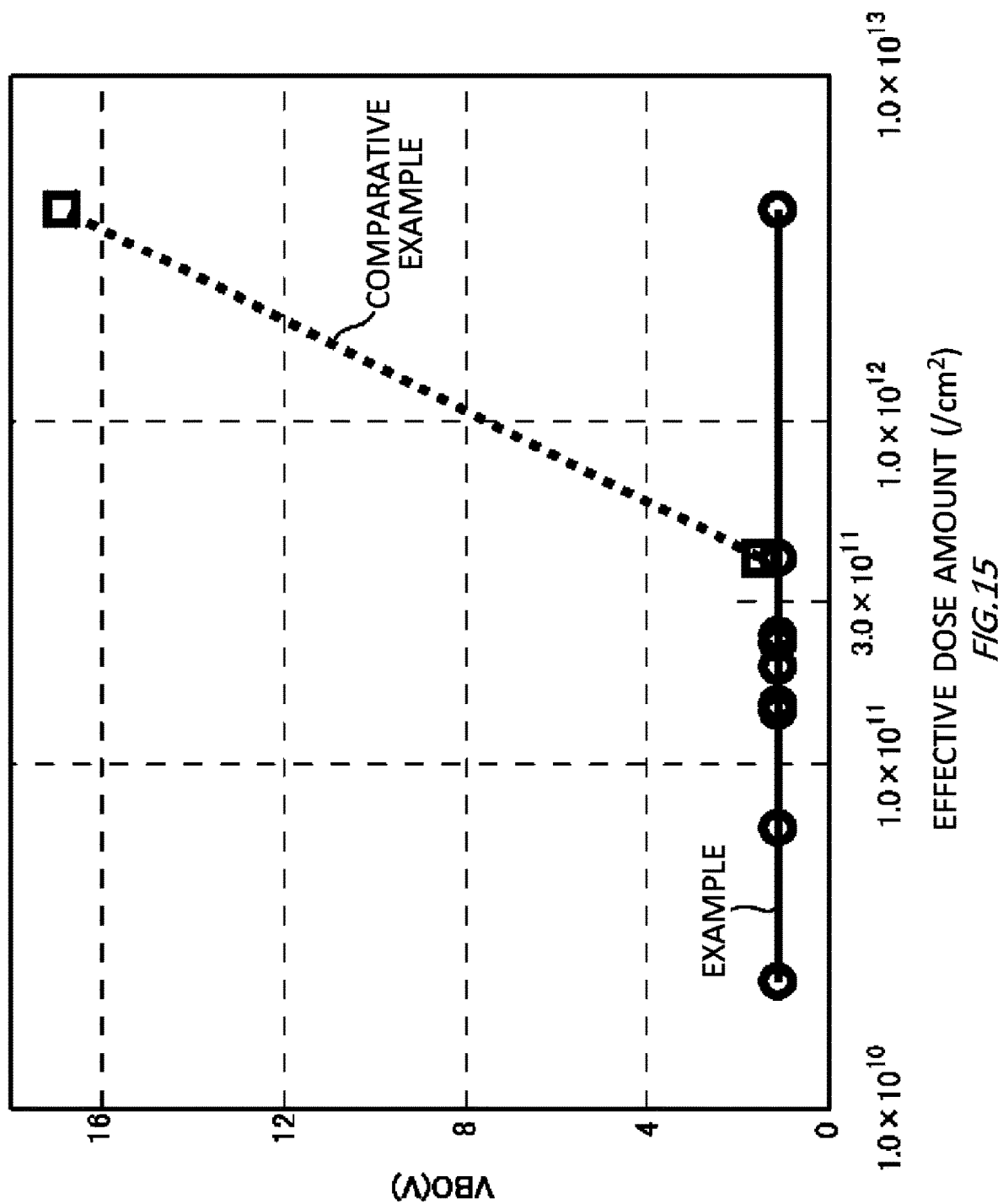
FIG. 15 illustrates a view showing a relationship between an effective dose amount of the first lower end region 201 and a trigger voltage VBO.

FIG. 15 illustrates a view showing a relationship between an effective dose amount of the first lower end region 201 and the trigger voltage VBO. The horizontal axis of FIG. 15 represents an effective dose amount ($cm^2$) of the first lower end region 201, and the vertical axis represents the trigger voltage VBO (V) of the snapback phenomenon. The effective dose amount of the first lower end region 201 is a value obtained by, after forming the first lower end region 201, multiplying a dose amount of dopant ions (for example, acceptor ions) per unit area ($cm^2$) in a direction parallel to the upper surface 21 of the semiconductor substrate 10 and an amount per unit area ($/cm^2$) of an impurity (for example, the bulk donor) already existing in the semiconductor substrate 10 by the number of valence charges (electrons or holes) per unit ion according to a type and polarity of the impurity, and then adding/subtracting the dose amount and impurity amount. For example, when the number of valence charges per unit ion is 1 for both the dopant and the existing impurity and the polarities are opposite (the P type and the N type), a value obtained by subtracting the impurity amount from the dose amount of dopant ions is the effective dose amount. The effective dose amount of the first lower end region 201 may be a value obtained by integrating a net doping concentration ($/cm^3$) of the first lower end region 201 in the depth direction. When the first lower end region 201 is formed through the ion implantation and diffusion process in the trench portion, the effective dose amount may differ from a dose amount from ion implantation equipment or a dose amount in a semiconductor right after the implantation, due to a shadow effect of a trench side wall, diffusion, or the like. The effective dose amount in FIG. 15 is a value at each position of the first mesa portion 61-1 when the first lower end region 201 is formed such that a distribution in the depth direction becomes substantially uniform at each position in the X axis direction excluding the end portion.

In FIG. 15, characteristics of a comparative example are indicated by a broken line, and characteristics of an example are indicated by a solid line. The structures of the comparative example and the example are similar to those of the example of FIG. 14. In the comparative example, when the effective dose amount exceeds $3.0 \times 10^{11}/cm^2$, the trigger voltage VBO rises according to the effective dose amount. In contrast, in the example, the trigger voltage VBO stays low irrespective of the effective dose amount. In other words, in the example, a snapback has not occurred irrespective of the effective dose amount of the first lower end region 201. Therefore, in the example, a degree of freedom in setting the effective dose amount of the first lower end region 201 can be set high.

The effective dose amount of the first lower end region 201 may be $3 \times 10^{11}/cm^2$ or more. By setting the effective dose amount of the first lower end region 201 to be high, an electric field strength in the vicinity of the lower ends of the trench portions in contact with the first lower end region 201 can be relaxed. Since the second lower end region 202 is provided next to the first lower end region 201 in the example, even when the effective dose amount of the first lower end region 201 is set high, the snapback can be suppressed as shown in FIG. 15. The effective dose amount of the first lower end region 201 may be $5 \times 10^{11}/cm^2$ or more, $1 \times 10^{12}/cm^2$ or more, or $5 \times 10^{12}/cm^2$ or more.

The trigger voltage VBO corresponds to a voltage at which at least one of the first lower end region 201 or the accumulation region 16 forming the PN junction is completely depleted. Accordingly, as indicated by the characteristics of the comparative example, the trigger voltage VBO varies depending on the effective dose amount in the first lower end region 201. If the width of the first lower end region 201 in the depth direction is constant and the doping concentration of the first lower end region 201 is uniform in the depth direction, similar characteristics can be obtained also in a case where the horizontal axis of FIG. 15 represents the doping concentration of the first lower end region 201. However, the width of the first lower end region 201 and a concentration profile in the depth direction may be diverse. By defining the impurity amount in the first lower end region 201 by the effective dose amount, a relationship between the impurity amount and the trigger voltage VBO can be specified irrespective of the width of the first lower end region 201 and a shape of the concentration profile in the depth direction.

Figure 16:
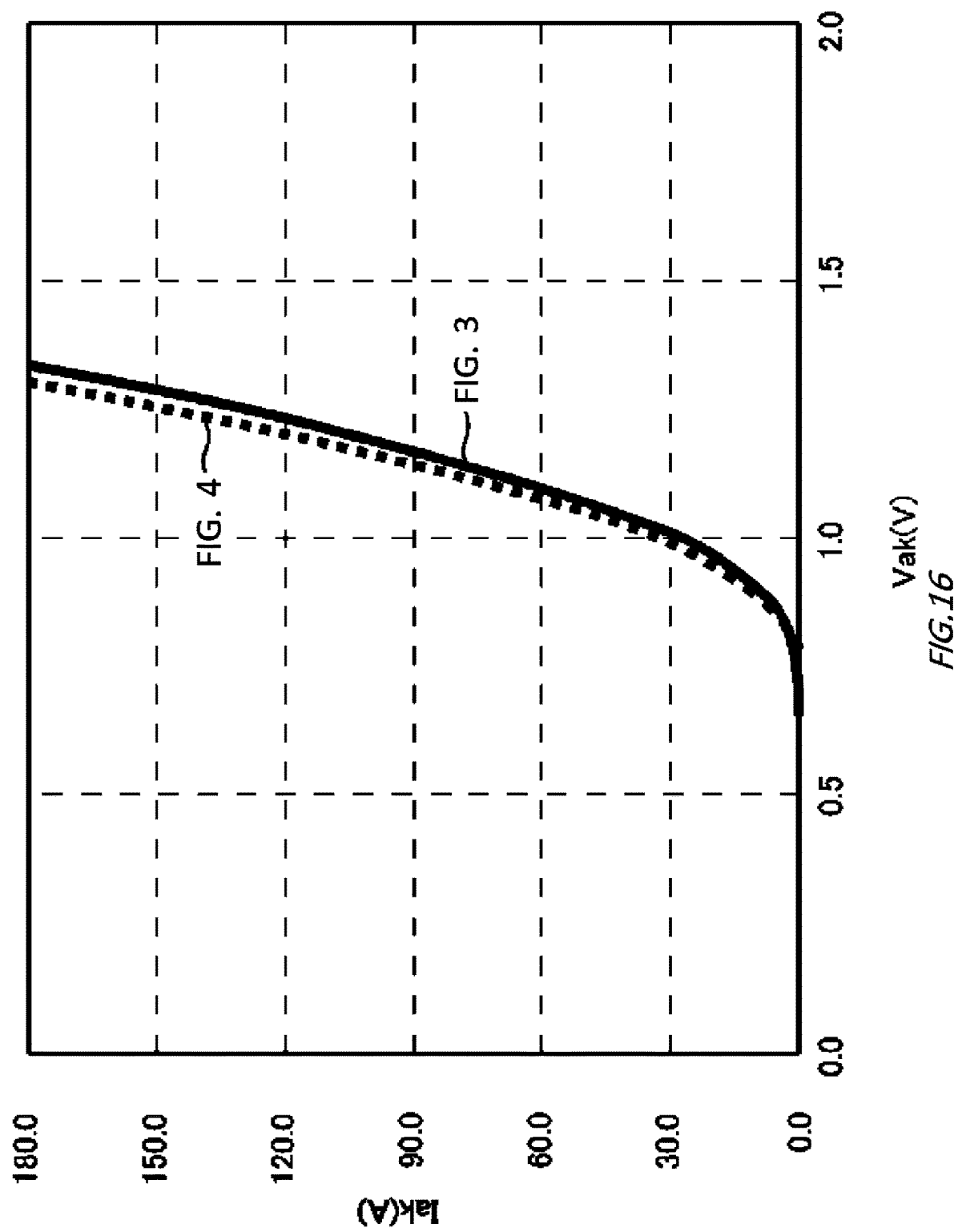
FIG. 16 illustrates a view showing an example of the forward conduction characteristics of the diode portion 80.

FIG. 16 illustrates a view showing an example of the forward conduction characteristics of the diode portion 80. The axes of FIG. 16 show a linear scale, and labels are similar to those of FIG. 14. In FIG. 16, characteristics of the example shown in FIG. 3 are indicated by a solid line, and characteristics of the example shown in FIG. 4 are indicated by a broken line. As described in FIG. 13 and the like, in the example shown in FIG. 4, the first mesa portion 61-1 operates as the thyristor. Therefore, as shown in FIG. 16, in the example of FIG. 4, the inter-anode-cathode current Iak that flows through the diode portion 80 can be increased as compared to the example of FIG. 3.

Figure 17:
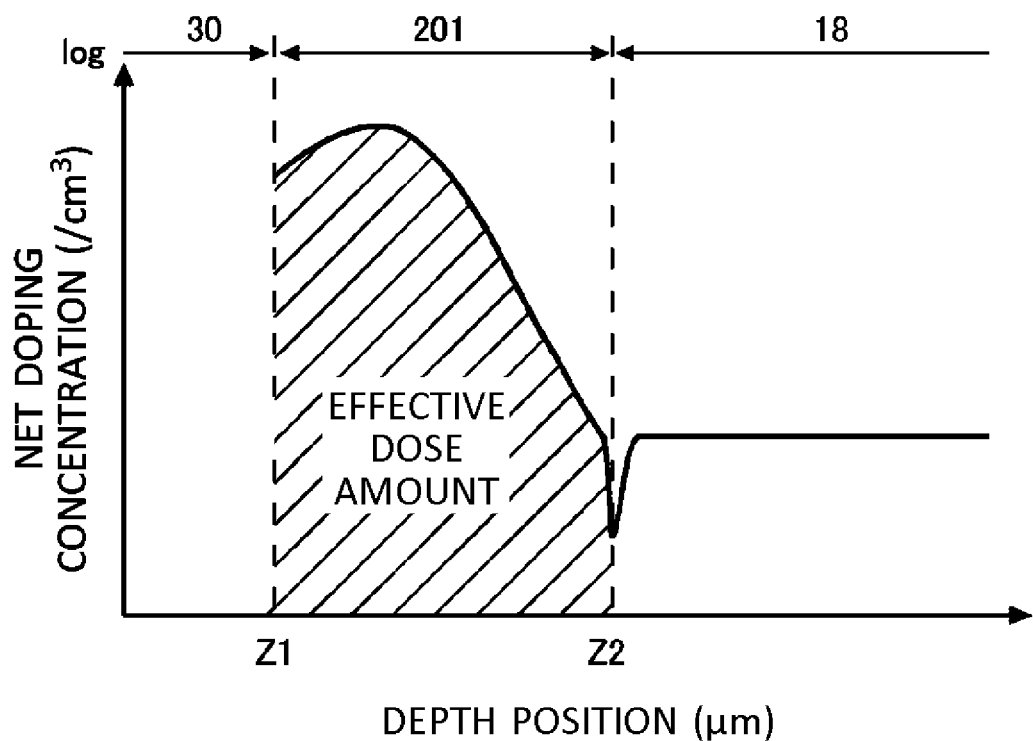
FIG. 17 illustrates a view for describing the effective dose amount in the first lower end region 201.

FIG. 17 illustrates a view for describing the effective dose amount in the first lower end region 201. FIG. 17 shows a net doping concentration distribution on the line m-m shown in FIG. 3. The doping concentration distribution of this example may be, for example, a carrier concentration distribution measured by an SRP method using a monitor wafer or process monitoring region in which the first lower end region 201 having a large area is formed. The doping concentration distribution may be obtained by thinning a singulated finished product from a cathode side, acquiring a SIMS profile from an opposite surface on an emitter-anode side, and converting it. The line m-m is a line parallel to the Z axis, that passes through the lower end of the trench portion in contact with the first mesa portion 61-1. The horizontal axis of FIG. 17 represents the depth position in the semiconductor substrate 10, and the vertical axis represents the net doping concentration.

In this example, an upper end position of the first lower end region 201 is the first depth position Z1, and a lower end position of the first lower end region 201 is a second depth position Z2. The second depth position Z2 is a position of a PN junction interface between the first lower end region 201 and the drift region 18. The second depth position Z2 may be a position at which the doping concentration shows a local minimum value between the first lower end region 201 and the drift region 18.

An area of a portion hatched with diagonal lines in FIG. 17 corresponds to the effective dose amount. A value obtained by integrating the doping concentration from the first depth position Z1 to the second depth position Z2 may be used as the effective dose amount.

Although the line m-m of this example passes through the lower end of the trench portion, in another example, the line m-m may pass through the center of the first mesa portion 61-1 in the X axis direction. In this case, the upper end position of the first lower end region 201 may be a position of a PN junction interface between the first lower end region 201 and the accumulation region 16. When the drift region 18 is provided in place of the accumulation region 16, the upper end position of the first lower end region 201 may be a position of a PN junction interface between the first lower end region 201 and the drift region 18 provided on the upper side of the first lower end region 201. Also in these cases, a value obtained by integrating the doping concentration from the upper end position to the lower end position of the first lower end region 201 may be used as the effective dose amount.

Figure 18:
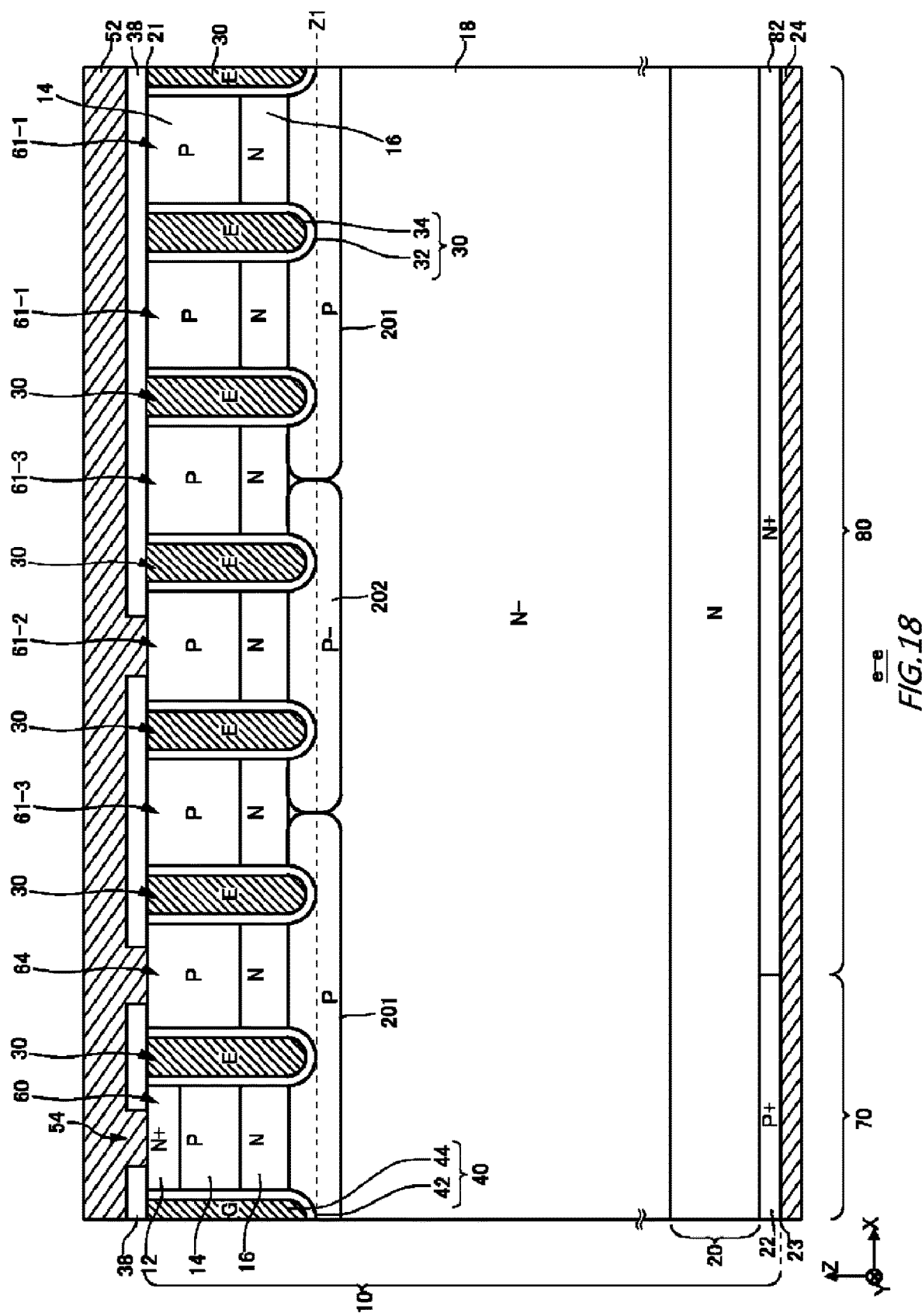
FIG. 18 illustrates a view showing another example of the cross section e-e in FIG. 2.

FIG. 18 illustrates a view showing another example of the cross section e-e in FIG. 2. The semiconductor device 100 of this example includes, as the second lower end region 202, a P– type region having a lower doping concentration than the first lower end region 201. Other structures are similar to those of any of the aspects described in FIGS. 1 to 17. Also in this example, a current is more easily caused to flow through the second lower end region 202 than the first lower end region 201. Therefore, the snapback in the diode portion 80 can be suppressed. Moreover, by providing the P– type region as the second lower end region 202, an electric field strength in the vicinity of the lower end of the trench portion in contact with the second lower end region 202 can be relaxed. The second lower end region 202 may alternatively include both the N type region shown in FIG. 3 and the like and the P– type region shown in FIG. 18. For example, the second lower end region 202 may include the P– type region shown in FIG. 18 at portions in contact with the first lower end regions 201 and include the N type region shown in FIG. 3 and the like at a portion sandwiched between the P– type regions.

The effective dose amount of the second lower end region 202 may be smaller than $3.0 \times 10^{11}/cm^2$. Even when the P type region in which the effective dose amount is smaller than $3.0 \times 10^{11}/cm^2$ is provided below the mesa portion 61 as shown in FIG. 15, a snapback did not occur. Therefore, by setting the effective dose amount of the second lower end region 202 to be smaller than $3.0 \times 10^{11}/cm^2$, a snapback can be suppressed. The effective dose amount of the second lower end region 202 may be $1.0 \times 10^{11}/cm^2$ or less or $5.0 \times 10^{10}/cm^2$ or less. The effective dose amount of the second lower end region 202 may be $1.0 \times 10^{10}/cm^2$ or more.

Similar to the example described in FIG. 17, the effective dose amount of the second lower end region 202 may be acquired by integrating the doping concentration on the line m-m in the depth direction. The line m-m may pass through the lower end of the trench portion in contact with the second mesa portion 61-2, or may pass through the center of the second mesa portion 61-2 in the X axis direction.

In the manufacturing process of the semiconductor device 100 described in FIGS. 1 to 18, after forming the trench portion of each trench portion and before forming the dummy dielectric film 32 and the dummy conductive portion 34 (or the gate dielectric film 42 and the gate conductive portion 44), dopant ions may be implanted from the lower end of the trench portion so as to form the first lower end region 201. By performing heat treatment after implanting the dopant ions, the dopant implanted into the lower end of each trench portion is diffused in the X axis direction, and thus the first lower end region 201 provided across two or more trench portions can be formed. In another example, the dopant ions may be implanted into an entire range in which the first lower end regions 201 are to be formed, from the upper surface of the semiconductor substrate 10, before forming the trench portions. When the N type region is provided as the second lower end region 202, P type dopant ions may be selectively implanted in a range in which the first lower end region 201 is to be formed so that the remaining drift region 18 is used as the second lower end region 202. In another example, after implanting the P type dopant ions in an entire range in which the first lower end region 201 and the second lower end region 202 are to be formed, the N type dopant ions may be counter-doped in a range in which the second lower end region 202 is to be formed so as to form the N type second lower end region 202. Further, when the P type region is provided as the second lower end region 202, the P type dopant ions may be selectively implanted in different dose amounts in the respective regions of the first lower end region 201 and the second lower end region 202. In another example, after the dopant ions are implanted in a uniform dose amount in the entire range in which the first lower end region 201 and the second lower end region 202 are to be formed, the P type dopant ions may be additionally implanted in a range in which the first lower end region 201 is to be formed.

While the present invention has been described by way of the embodiments, the technical scope of the present invention is not limited to the above described embodiments. It is apparent to persons skilled in the art that various alterations or improvements can be made to the above described embodiments. It is also apparent from the description of the claims that embodiments added with such alterations or improvements can be included in the technical scope of the present invention.

The operations, procedures, steps, and stages of each process performed by a device, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device, comprising:
   a semiconductor substrate which has an upper surface and a lower surface, includes a drift region of a first conductivity type between the upper surface and the lower surface, and is provided with a diode portion, wherein
   the diode portion includes:
   a cathode region of a first conductivity type, which is provided between the lower surface of the semiconductor substrate and the drift region and has a higher doping concentration than the drift region;
   a base region of a second conductivity type, which is provided between the upper surface of the semiconductor substrate and the drift region;
   a plurality of trench portions which are provided to positions below the base region from the upper surface of the semiconductor substrate and are arranged next to one another in a first direction on the upper surface of the semiconductor substrate;
   a first lower end region of a second conductivity type, which is arranged at a first depth position and is provided in contact with a lower end of two or more of the trench portions; and a second lower end region which is arranged at the first depth position and is arranged at a position not overlapping with the first lower end region, and the second lower end region includes at least one of a region of a first conductivity type or a region of a second conductivity type which has a lower doping concentration than the first lower end region.

2. The semiconductor device according to claim 1, wherein an effective dose amount obtained by integrating a doping concentration of the first lower end region in a depth direction is $3 \times 10^{11}/\text{cm}^2$ or more.

3. The semiconductor device according to claim 1, wherein the second lower end region is the region of the first conductivity type.

4. The semiconductor device according to claim 1, wherein the second lower end region is the region of the second conductivity type, in which an effective dose amount obtained by integrating a doping concentration in the depth direction is smaller than $3 \times 10^{11}/\text{cm}^2$.

5. The semiconductor device according to claim 1, wherein the diode portion further includes an intermediate region of a first conductivity type, which is provided between the first depth position and the base region.

6. The semiconductor device according to claim 5, wherein a doping concentration of the intermediate region is higher than a doping concentration of the drift region.

7. The semiconductor device according to claim 1, wherein the first lower end region and the second lower end region are arranged next to each other in the first direction.

8. The semiconductor device according to claim 7, wherein the diode portion further includes a plurality of mesa portions each sandwiched between two of the trench portions inside the semiconductor substrate, the plurality of mesa portions include:

one or more first mesa portions in which the first lower end region is arranged in contact with the lower end of two of the trench portions adjacent to each other; and one or more second mesa portions in which the second lower end region is arranged in contact with the lower end of two of the trench portions adjacent to each other, and at least one of the first mesa portions and at least one of the second mesa portions are arranged next to each other in the first direction.

9. The semiconductor device according to claim 8, wherein at least one of the second mesa portions is arranged while being sandwiched between two of the first mesa portions in the first direction.

10. The semiconductor device according to claim 8, further comprising:

an upper surface electrode provided above the upper surface of the semiconductor substrate, wherein at least one of the second mesa portions is connected to the upper surface electrode.

11. The semiconductor device according to claim 10, wherein at least one of the first mesa portions is insulated from the upper surface electrode.

12. The semiconductor device according to claim 10, wherein at least one of the first mesa portions is connected to the upper surface electrode.

13. The semiconductor device according to claim 8, wherein the plurality of mesa portions include a third mesa portion in which the first lower end region is arranged in contact with the lower end of one of two of the trench portions adjacent to each other, and in which the second lower end region is arranged in contact with the lower end of the other one of two of the trench portions adjacent to each other, and at least one of the first mesa portions, at least one of the second mesa portions, and the third mesa portion are arranged next to one another in the first direction.

14. The semiconductor device according to claim 13, wherein the third mesa portion is arranged between at least one of the first mesa portions and at least one of the second mesa portions in the first direction.

15. The semiconductor device according to claim 8, wherein the semiconductor substrate is further provided with a transistor portion which is arranged next to the diode portion in the first direction and is provided with a collector region of a second conductivity type on the lower surface of the semiconductor substrate, the transistor portion includes a plurality of the mesa portions, and the mesa portion closest to the diode portion out of a plurality of the mesa portions of the transistor portion is provided with the first lower end region.

16. The semiconductor device according to claim 15, further comprising:

a boundary mesa portion which is provided in the semiconductor substrate and is arranged above a boundary between the cathode region and the collector region in the first direction; and an upper surface electrode arranged above the upper surface of the semiconductor substrate, wherein the boundary mesa portion is the first mesa portion connected to the upper surface electrode.

17. The semiconductor device according to claim 15, further comprising:

a boundary mesa portion which is provided in the semiconductor substrate and is arranged above a boundary between the cathode region and the collector region in the first direction; and an upper surface electrode arranged above the upper surface of the semiconductor substrate, wherein the boundary mesa portion is the first mesa portion insulated from the upper surface electrode.

18. The semiconductor device according to claim 15, wherein a doping concentration of the first lower end region in the transistor portion differs from a doping concentration of the first lower end region in the diode portion.

19. The semiconductor device according to claim 1, wherein each of the trench portions has a longitudinal length in a second direction different from the first direction on the upper surface of the semiconductor substrate, and the first lower end region and the second lower end region are arranged next to each other in the second direction.

20. The semiconductor device according to claim 19, wherein
- at least one of the second lower end regions is arranged while being sandwiched between the first lower end regions in the second direction.

21. The semiconductor device according to claim 19, further comprising:
- an upper surface electrode arranged above the upper surface of the semiconductor substrate; and
- an interlayer dielectric film which is arranged between the upper surface electrode and the semiconductor substrate and is provided with a contact hole for connecting the upper surface electrode and the semiconductor substrate,
- wherein at least one of the second lower end regions includes a portion overlapping with the contact hole in a top view.

22. The semiconductor device according to claim 19, wherein
- the diode portion further includes a contact region of a second conductivity type, which is provided between the base region and the upper surface of the semiconductor substrate and has a higher doping concentration than the base region, and
- at least one of the second lower end regions includes a portion overlapping with the contact region in a top view.

23. The semiconductor device according to claim 19, wherein
- the first lower end region and the second lower end region are arranged next to each other in both the first direction and the second direction.

* * * * *